(12) United States Patent
Rehder et al.

(10) Patent No.: US 12,100,774 B2
(45) Date of Patent: Sep. 24, 2024

(54) SOLAR CELLS FOR A SOLAR CELL ARRAY

(71) Applicant: The Boeing Company, Chicago, IL (US)

(72) Inventors: Eric Rehder, Los Angeles, CA (US);
Philip Chiu, Los Angeles, CA (US);
Tom Crocker, Los Angeles, CA (US);
Daniel Law, Los Angeles, CA (US);
Dale Waterman, Rancho Cucamonga, CA (US)

(73) Assignee: THE BOEING COMPANY, Arlington, VA (US)

( * ) Notice: Subject to any disclaimer, the term of this patent is extended or adjusted under 35 U.S.C. 154(b) by 0 days.

(21) Appl. No.: 17/878,348

(22) Filed: Aug. 1, 2022

(65) Prior Publication Data

US 2022/0367741 A1    Nov. 17, 2022

Related U.S. Application Data

(63) Continuation of application No. 15/643,289, filed on Jul. 6, 2017, now Pat. No. 11,437,533.
(Continued)

(51) Int. Cl.
*H01L 31/042* (2014.01)
*H01L 21/02* (2006.01)
(Continued)

(52) U.S. Cl.
CPC ...... *H01L 31/042* (2013.01); *H01L 21/02439* (2013.01); *H01L 27/142* (2013.01);
(Continued)

(58) Field of Classification Search
CPC ..... H01L 31/042; H01L 31/02; H01L 31/044; H01L 21/02439; H01L 31/035281;
(Continued)

(56) References Cited

U.S. PATENT DOCUMENTS 3,376,164 A    4/1968  Bachwansky
3,833,426 A    9/1974  Mesch
(Continued)

FOREIGN PATENT DOCUMENTS

CN    103155158 A    6/2013
CN    203277428 U    11/2013
(Continued)

OTHER PUBLICATIONS

Non-Final Office Action dated Sep. 15, 2022 for U.S. Appl. No. 16/543,279.
(Continued)

*Primary Examiner* — Michael Y Sun
(74) *Attorney, Agent, or Firm* — GATES & COOPER LLP

(57) ABSTRACT

A solar cell for a solar cell array with one or more grid on a surface thereof, wherein electrical connections are made to the grids in a plurality of locations positioned around the solar cell; and the electrical connections extend to one or more conductors located under the solar cell. The conductors located under the solar cell are buried within a substrate, and each of the conductors comprises a low resistance conducting path that distributes current from the solar cell. The conductors are loops, U-shaped, or have only up or down pathways. The solar cell comprises a full cell that has four cropped corners and the locations are in the cropped corners.

21 Claims, 27 Drawing Sheets

Related U.S. Application Data

(60) Provisional application No. 62/394,641, filed on Sep. 14, 2016, provisional application No. 62/394,636, filed on Sep. 14, 2016, provisional application No. 62/394,666, filed on Sep. 14, 2016, provisional application No. 62/394,623, filed on Sep. 14, 2016, provisional application No. 62/394,649, filed on Sep. 14, 2016, provisional application No. 62/394,632, filed on Sep. 14, 2016, provisional application No. 62/394,616, filed on Sep. 14, 2016, provisional application No. 62/394,672, filed on Sep. 14, 2016, provisional application No. 62/394,629, filed on Sep. 14, 2016, provisional application No. 62/394,627, filed on Sep. 14, 2016, provisional application No. 62/394,371, filed on Sep. 14, 2016, provisional application No. 62/394,667, filed on Sep. 14, 2016.

(51) Int. Cl.
| | |
|---|---|
| *H01L 27/142* | (2014.01) |
| *H01L 31/02* | (2006.01) |
| *H01L 31/0224* | (2006.01) |
| *H01L 31/0352* | (2006.01) |
| *H01L 31/0392* | (2006.01) |
| *H01L 31/044* | (2014.01) |
| *H01L 31/0443* | (2014.01) |
| *H01L 31/048* | (2014.01) |
| *H01L 31/05* | (2014.01) |
| *H01L 31/0687* | (2012.01) |
| *H02S 40/34* | (2014.01) |

(52) U.S. Cl.
CPC ........ *H01L 31/02* (2013.01); *H01L 31/02008* (2013.01); *H01L 31/02021* (2013.01); *H01L 31/022425* (2013.01); *H01L 31/035281* (2013.01); *H01L 31/03529* (2013.01); *H01L 31/0392* (2013.01); *H01L 31/044* (2014.12); *H01L 31/0443* (2014.12); *H01L 31/048* (2013.01); *H01L 31/05* (2013.01); *H01L 31/0504* (2013.01); *H01L 31/0508* (2013.01); *H01L 31/0516* (2013.01); *H01L 31/0687* (2013.01); *H02S 40/34* (2014.12); *Y02E 10/544* (2013.01)

(58) Field of Classification Search
CPC ........... H01L 31/0508; H01L 31/02008; H01L 31/02021; H01L 31/05; H01L 31/048; H01L 31/0687; H01L 31/0392; H01L 31/03529; H01L 31/035227; H01L 31/022425; H01L 31/0504; H01L 27/142; H01L 31/0516; H01L 31/0443; H02S 40/34; Y02E 10/544; Y02E 10/50; Y02P 70/50
See application file for complete search history.

(56) References Cited

U.S. PATENT DOCUMENTS

| | | | |
|---|---|---|---|
| 4,057,439 A | 11/1977 | Lindmayer | |
| 4,101,101 A | 7/1978 | Barkats et al. | |
| 4,257,821 A | 3/1981 | Kelly et al. | |
| 4,481,378 A | 11/1984 | Lesk | |
| 4,755,231 A * | 7/1988 | Kurland | H01L 31/041 136/244 |
| 5,330,583 A | 7/1994 | Asai et al. | |
| 5,391,235 A | 2/1995 | Inoue | |
| 5,567,248 A | 10/1996 | Chung | |
| 5,701,067 A | 12/1997 | Kaji et al. | |
| 5,855,692 A | 1/1999 | Kaji et al. | |
| 6,008,448 A | 12/1999 | Peck | |
| 6,034,322 A | 3/2000 | Pollard | |
| 6,156,967 A | 12/2000 | Ralph et al. | |
| 6,313,396 B1 | 11/2001 | Glenn | |
| 6,350,944 B1 | 2/2002 | Sherif et al. | |
| 6,441,297 B1 | 8/2002 | Keller et al. | |
| 6,543,725 B1 | 4/2003 | Meurer et al. | |
| 6,555,739 B2 | 4/2003 | Kawam | |
| 6,563,289 B1 | 5/2003 | Cross | |
| 6,637,702 B1 | 10/2003 | McCandless | |
| 8,604,330 B1 | 12/2013 | Hennessy et al. | |
| 8,814,099 B1 | 8/2014 | Harvey et al. | |
| 9,120,583 B1 | 9/2015 | Spence et al. | |
| 9,758,261 B1 | 9/2017 | Steinfeldt | |
| 10,189,582 B1 | 1/2019 | Spence et al. | |
| 2003/0057533 A1 | 3/2003 | Lemmi et al. | |
| 2004/0118446 A1 | 6/2004 | Toyomura | |
| 2005/0133079 A1 | 6/2005 | Boulanger et al. | |
| 2006/0170435 A1 | 8/2006 | Granicher et al. | |
| 2007/0005843 A1 | 1/2007 | Sim et al. | |
| 2007/0152194 A1 | 7/2007 | Natekar et al. | |
| 2008/0000523 A1 | 1/2008 | Hilgarth et al. | |
| 2008/0142071 A1 | 6/2008 | Dorn et al. | |
| 2008/0245405 A1 | 10/2008 | Garvison et al. | |
| 2008/0295889 A1 | 12/2008 | Schindler et al. | |
| 2009/0183760 A1 | 7/2009 | Meyer | |
| 2009/0255571 A1 | 10/2009 | Xia et al. | |
| 2009/0272436 A1 | 11/2009 | Cheung | |
| 2009/0288702 A1 | 11/2009 | Kim et al. | |
| 2010/0012172 A1 | 1/2010 | Meakin et al. | |
| 2010/0089435 A1 | 4/2010 | Lockenhoff | |
| 2010/0126560 A1 | 5/2010 | Lauvray et al. | |
| 2010/0186795 A1 | 7/2010 | Gaul | |
| 2010/0212741 A1 | 8/2010 | Lin | |
| 2010/0295383 A1 | 11/2010 | Cummings | |
| 2010/0313954 A1 | 12/2010 | Seel et al. | |
| 2011/0041890 A1* | 2/2011 | Sheats | H01L 31/022433 136/244 |
| 2011/0073163 A1 | 3/2011 | Cheung | |
| 2011/0079263 A1 | 4/2011 | Avrutsky | |
| 2011/0120752 A1 | 5/2011 | Imai et al. | |
| 2011/0138609 A1 | 6/2011 | Cherukupalli | |
| 2011/0168238 A1 | 7/2011 | Metin et al. | |
| 2011/0198444 A1 | 8/2011 | Dong | |
| 2011/0210209 A1 | 9/2011 | Taylor et al. | |
| 2012/0103388 A1 | 5/2012 | Meakin et al. | |
| 2012/0125391 A1 | 5/2012 | Pinarbasi et al. | |
| 2012/0161801 A1 | 6/2012 | Hasegawa | |
| 2012/0167954 A1 | 7/2012 | Meakin et al. | |
| 2012/0199176 A1 | 8/2012 | Hong et al. | |
| 2012/0313455 A1 | 12/2012 | Latham | |
| 2013/0014802 A1 | 1/2013 | Zimmerman | |
| 2013/0056047 A1 | 3/2013 | Beck et al. | |
| 2013/0263915 A1 | 10/2013 | Snidow | |
| 2014/0000682 A1 | 1/2014 | Zhao | |
| 2014/0033625 A1 | 2/2014 | Jenkins et al. | |
| 2014/0083497 A1 | 3/2014 | Ehrenpfordt et al. | |
| 2014/0102507 A1 | 4/2014 | Young | |
| 2014/0166067 A1 | 6/2014 | McGlynn et al. | |
| 2014/0255780 A1 | 9/2014 | Mikhaylik et al. | |
| 2014/0366927 A1 | 12/2014 | Lavrova et al. | |
| 2015/0083191 A1 | 3/2015 | Gmundner | |
| 2015/0096607 A1 | 4/2015 | Yong | |
| 2015/0144173 A1 | 5/2015 | Hoang et al. | |
| 2015/0287862 A1 | 10/2015 | Pardell Vilella | |
| 2015/0318420 A1 | 11/2015 | Sewell et al. | |
| 2015/0349703 A1* | 12/2015 | Morad | H01L 31/049 136/251 |
| 2016/0112004 A1 | 4/2016 | Thiel et al. | |
| 2016/0126380 A1 | 5/2016 | Chang | |
| 2016/0197207 A1* | 7/2016 | Morioka | H01L 31/1804 438/98 |
| 2016/0218665 A1 | 7/2016 | Crist | |
| 2016/0380221 A1 | 12/2016 | Gotanda et al. | |
| 2017/0018670 A1 | 1/2017 | Bende et al. | |
| 2017/0040933 A1 | 2/2017 | Vogel | |
| 2017/0054406 A1 | 2/2017 | Narla et al. | |
| 2017/0098736 A1 | 4/2017 | Lee et al. | |
| 2017/0163212 A1 | 6/2017 | France et al. | |

(56) References Cited

U.S. PATENT DOCUMENTS

| | | | |
|---|---|---|---|
| 2017/0229692 | A1 | 8/2017 | Thiel et al. |
| 2017/0374737 | A1 | 12/2017 | Jeong et al. |
| 2019/0127089 | A1 | 5/2019 | Tomoda et al. |
| 2019/0140584 | A1 | 5/2019 | Hayashi et al. |

FOREIGN PATENT DOCUMENTS

| | | |
|---|---|---|
| CN | 104241406 A | 12/2014 |
| CN | 104443439 A | 3/2015 |
| DE | 1013644 B | 8/1957 |
| DE | 10136442 A1 | 2/2003 |
| EP | 1160876 A2 | 12/2001 |
| EP | 1548847 A2 | 6/2005 |
| EP | 3297042 A1 | 3/2018 |
| EP | 2981156 B1 | 2/2019 |
| EP | 3562032 A1 | 10/2019 |
| EP | 2833416 B1 | 11/2021 |
| JP | 2001111089 A | 4/2001 |
| JP | 2002050782 A | 2/2002 |
| JP | 2002190612 A | 7/2002 |
| JP | 2005200006 A | 7/2005 |
| JP | 2008512860 A | 4/2008 |
| JP | 2010103441 A | 5/2010 |
| JP | 2010219349 A | 9/2010 |
| JP | 2011071214 A | 4/2011 |
| JP | 2011210747 A | 10/2011 |
| JP | 2012043981 A | 3/2012 |
| JP | 2012204651 A | 10/2012 |
| JP | 2013048166 A | 3/2013 |
| JP | 2013175624 A | 9/2013 |
| JP | 2014508939 A | 4/2014 |
| JP | 2014533072 A | 12/2014 |
| JP | 2016500998 A | 1/2016 |
| JP | 2017510083 A | 4/2017 |
| WO | 2009012567 A1 | 1/2009 |
| WO | 2012122131 A3 | 11/2012 |
| WO | 2014046699 A1 | 3/2014 |
| WO | 2015150514 A1 | 10/2015 |

OTHER PUBLICATIONS

Final Office Action dated Jun. 15, 2020 for U.S. Appl. No. 15/787,291.
Final Office Action dated Jun. 3, 2022 for U.S. Appl. No. 15/643,279.
Final Office Action dated Jun. 6, 2019 for U.S. Appl. No. 15/643,282.
Final Office Action dated Jun. 8, 2020 for U.S. Appl. No. 15/643,285.
Final Office Action dated Mar. 12, 2021 for U.S. Appl. No. 15/643,282.
Final Office Action dated Mar. 5, 2021 for U.S. Appl. No. 15/643,279.
Final Office Action dated May 19, 2020 for U.S. Appl. No. 15/787,304.
Final Office Action dated Oct. 10, 2019 for U.S. Appl. No. 15/643,277.
Final Office Action dated Oct. 1, 2020 for U.S. Appl. No. 15/643,289.
Final Office Action dated Sep. 2, 2020 for U.S. Appl. No. 15/643,274.
Japanese Appeal Preliminary Examination Report dated Jun. 21, 2022 for JP Application No. 2017-176667.
Japanese Notice of Reasons for Rejection dated Apr. 26, 2022 for Japanese Application No. 2018-109908.
Japanese Notice of Reasons for Rejection dated Apr. 5, 2022 for JP Application No. 2018-109912.
Japanese Notice of Reasons for Rejection dated Jan. 11, 2022 for Japanese Patent Application No. 2017-176673.
Japanese Notice of Reasons for Rejection dated Oct. 5, 2021 for Japanese Application No. 2017-176669.
Japanese Notice of Reasons for Rejection dated Oct. 5, 2021 for Japanese Application No. 2017-176672.
Japanese Notification of Reasons for Refusal dated Oct. 5, 2021 for JP Application No. 2017-176670.
Non-Final Office Action dated Apr. 27, 2021 for U.S. Appl. No. 15/938,787.
Non-Final Office Action dated Apr. 23, 2018 for U.S. Appl. No. 15/623,489.
Non-Final Office Action dated Apr. 30, 2019 for U.S. Appl. No. 15/643,277.
Non-Final Office Action dated Aug. 18, 2021 for U.S. Appl. No. 15/643,285.
Non-Final Office Action dated Aug. 18, 2021 for U.S. Appl. No. 15/787,291.
Non-Final Office Action dated Aug. 18, 2021 for U.S. Appl. No. 15/787,304.
Non-Final Office Action dated Aug. 2, 2021 for U.S. Appl. No. 15/643,282.
Non-Final Office Action dated Dec. 22, 2020 for U.S. Appl. No. 15/643,285.
Non-Final Office Action dated Dec. 6, 2021 for U.S. Appl. No. 15/643,279.
Non-Final Office Action dated Dec. 7, 2020 for U.S. Appl. No. 15/787,304.
Non-Final Office Action dated Dec. 9, 2019 for U.S. Appl. No. 15/643,282.
Non-Final Office Action dated Feb. 1, 2021 for U.S. Appl. No. 15/643,277.
Non-Final Office Action dated Feb. 18, 2021 for U.S. Appl. No. 15/938,791.
Non-Final Office Action dated Feb. 21, 2019 for U.S. Appl. No. 15/643,285.
Non-Final Office Action dated Feb. 4, 2020 for U.S. Appl. No. 15/787,291.
Non-Final Office Action dated Feb. 5, 2019 for U.S. Appl. No. 15/643,282.
Non-Final Office Action dated Feb. 5, 2019 for Utility U.S. Appl. No. 15/643,282.
Non-Final Office Action dated Feb. 8, 2019 for U.S. Appl. No. 15/643,274.
Non-Final Office Action dated Feb. 8, 2019 for Utility U.S. Appl. No. 15/643,274.
Non-Final Office Action dated Jan. 17, 2020 for U.S. Appl. No. 15/643,285.
Non-Final Office Action dated Jan. 28, 2019 for U.S. Appl. No. 15/643,289.
Non-Final Office Action dated Jan. 3, 2020 for U.S. Appl. No. 15/938,787.
Non-Final Office Action dated Jan. 7, 2021 for U.S. Appl. No. 15/787,291.
Non-Final Office Action dated Jan. 8, 2020 for U.S. Appl. No. 15/787,304.
Notice of Allowance dated Jun. 23, 2022 for U.S. Appl. No. 16/847,359.
Non-Final Office Action dated Jul. 23, 2019 for U.S. Appl. No. 15/643,279.
Non-Final Office Action dated Jul. 28, 2020 for U.S. Appl. No. 15/643,279.
Non-Final Office Action dated Jul. 30, 2018 for U.S. Appl. No. 15/643,277.
Non-Final Office Action dated Mar. 14, 2019 for U.S. Appl. No. 15/787,291.
Non-Final Office Action dated Mar. 14, 2019 for U.S. Appl. No. 15/787,304.
Non-Final Office Action dated Mar. 14, 2022 for U.S. Appl. No. 15/643,282.
Non-Final Office Action dated Mar. 19, 2020 for U.S. Appl. No. 15/643,289.
Non-Final Office Action dated Mar. 24, 2020 for U.S. Appl. No. 15/643,277.
Non-Final Office Action dated Mar. 31, 2020 for U.S. Appl. No. 15/643,274.
Non-Final Office Action dated May 12, 2021 for U.S. Appl. No. 15/643,274.
Non-Final Office Action dated Nov. 22, 2019 for U.S. Appl. No. 15/938,791.
Non-Final Office Action dated Nov. 9, 2020 for U.S. Appl. No. 15/643,282.
Non-Final Office Action dated Oct. 5, 2018 for U.S. Appl. No. 15/643,279.

(56) References Cited

OTHER PUBLICATIONS

Non-Final Office Action dated Sep. 17, 2021 for U.S. Appl. No. 15/643,277.
Non-Final Office Action dated Sep. 27, 2019 for U.S. Appl. No. 15/643,287.
Notice of Allowance dated Apr. 23, 2020 for U.S. Appl. No. 15/643,287.
Stern, T., et al., "Modular Solar Panels Using Components Engineered for Producibility", Photovoltaic Specialists Conference (PVSC), 2011 37th IEEE, Jun. 19-24, 2011, pp. 001626-001629.
Walmsley, N., et al., "Increasing the TRL Level of New PV Technologies Using Modular Solar Panels", Photovoltaic Specialists Conference (PVSC), 2012 38th IEEE, Jun. 3-8, 2012, pp. 002835-002839.
Final Office Action dated Aug. 25, 2022 for U.S. Appl. No. 15/643,282.
Baumli et al., "Solder Materials with Micro and Nanoparticles: A Review", Materials Science and Engineering, Jan. 1, 2015, pp. 42-49.
English translation of DE10136442.
EPO Communication dated Dec. 2, 2020 for EP application No. 17191134.0.
EPO Communication dated May 12, 2022 for EP Application No. 18176224.6.
European Communication dated Feb. 19, 2020 for EP Application No. 18176224.6.
European Examination Communication dated Dec. 1, 2020 for EP Application No. 17191162.1.
European Examination Report dated Dec. 16, 2021 for European Patent Application No. 17191175.3.
European Search Report dated Dec. 19, 2017 for EP application No. 17191162.1.
European Search Report dated Dec. 21, 2017 for EP application No. 17191166.2.
European Search Report dated Dec. 4, 2017 for EP application No. 17191134.
Extended European Search Report dated Apr. 29, 2021 for EP Application No. 21164063.6.
Extended European Search Report dated Dec. 19, 2017 for EP application No. 17191168.8.
Extended European Search Report dated Dec. 7, 2017 for EP application No. 17191154.8.
Extended European Search Report dated Dec. 8, 2017for EP application No. 17191159.7.
Extended European Search Report dated Jul. 8, 2019 for EP application No. 19162438.6.
Extended European Search Report dated Jul. 8, 2019 for European Patent Application No. 19162438.6.
Extended European Search Report dated Nov. 12, 2018 for EP Application No. 18176222.0.
Extended European Search Report dated Nov. 8, 2018 for EP Application No. 18176224.6.
Final Office Action dated Apr. 22, 2021 for U.S. Appl. No. 15/787,291.
Final Office Action dated Apr. 10, 2019 for U.S. Appl. No. 15/643,279.
Final Office Action dated Apr. 10, 2020 for U.S. Appl. No. 15/643,282.
Final Office Action dated Apr. 15, 2020 for U.S. Appl. No. 15/938,791.
Final Office Action dated Apr. 22, 2021 for U.S. Appl. No. 15/643,285.
Final Office Action dated Aug. 13, 2021 for U.S. Appl. No. 15/938,791.
Final Office Action dated Aug. 22, 2019 for U.S. Appl. No. 15/643,274.
Final Office Action dated Aug. 28, 2018 for U.S. Appl. No. 15/643,289.
Final Office Action dated Aug. 6, 2019 for U.S. Appl. No. 15/643,289.
Final Office Action dated Dec. 15, 2021 for U.S. Appl. No. 15/787,304.
Final Office Action dated Dec. 17, 2021 for U.S. Appl. No. 15/787,291.
Final Office Action dated Dec. 28, 2021 for U.S. Appl. No. 15/643,282.
Final Office Action dated Dec. 9, 2021 for U.S. Appl. No. 15/938,787.
Final Office Action dated Feb. 11, 2022 for U.S. Appl. No. 16/847,032.
Final Office Action dated Feb. 14, 2022 for U.S. Appl. No. 16/847,359.
Final Office Action dated Feb. 24, 2022 for U.S. Appl. No. 15/643,277.
Final Office Action dated Feb. 6, 2020 for U.S. Appl. No. 15/643,279.
Final Office Action dated Feb. 6, 2020 for U.S. Appl. No. 15/643,287.
Final Office Action dated Jan. 15, 2019 for U.S. Appl. No. 15/643,277.
Final Office Action dated Jan. 15, 2019 for Utility U.S. Appl. No. 15/643,277.
Final Office Action dated Jan. 20, 2022 for U.S. Appl. No. 15/643,285.
Final Office Action dated Jul. 10, 2020 for U.S. Appl. No. 15/938,787.
Final Office Action dated Jul. 12, 2019 for U.S. Appl. No. 15/643,285.
Final Office Action dated Jul. 17, 2019 for U.S. Appl. No. 15/6787,291.
Final Office Action dated Jul. 28, 2020 for U.S. Appl. No. 15/643,277.
Final Office Action dated Jul. 9, 2019 for U.S. Appl. No. 15/787,304.
Final Office Action dated Jun. 1, 2021 for U.S. Appl. No. 15/643,277.
Final Office Action dated Dec. 1, 2022 for U.S. Appl. No. 15/643,277.
Non-Final Office Action dated Dec. 22, 2022 for U.S. Appl. No. 15/938,787.
Non-Final Office Action dated Dec. 20, 2022 for U.S. Appl. No. 15/643,282.
Final Office Action dated Mar. 31, 2023 for U.S. Appl. No. 15/643,279.
Non-Final Office Action dated Nov. 14, 2022 for U.S. Appl. No. 15/643,285.
Final Office Action dated Feb. 6, 2023 for U.S. Appl. No. 17/100,823.
Final Office Action dated Jun. 15, 2023 for U.S. Appl. No. 15/643,285.
Non-Final Office Action dated May 11, 2023 for U.S. Appl. No. 15/643,277.
Non-Final Office Action dated Apr. 19, 2023 for U.S. Appl. No. 15/787,304.
Final Office Action dated Apr. 18, 2023 for U.S. Appl. No. 16/991,589.
Final Office Action dated Jun. 22, 2023 for U.S. Appl. No. 15/938,787.
Final Office Action dated Jun. 27, 2023 for U.S. Appl. No. 15/643,282.
Non-Final Office Action dated May 5, 2023 for U.S. Appl. No. 15/797,291.
Non-Final Office Action dated Aug. 4, 2023 for U.S. Appl. No. 17/100,823.
Final Office Action dated Sep. 11, 2023 for U.S. Appl. No. 15/787,291.
Non-Final Office Action dated Nov. 9, 2023 for U.S. Appl. No. 15/643,282.
Non-Final Office Action dated Oct. 25, 2023 for U.S. Appl. No. 15/643,274.
Final Office Action dated Oct. 10, 2023 for U.S. Appl. No. 15/938,791.
Non-Final Office Action dated Sep. 13, 2023 for U.S. Appl. No. 15/643,279.
Non-Final Office Action dated Sep. 20, 2023 for U.S. Appl. No. 16/991,589.
Final Office Action dated Nov. 15, 2023 for U.S. Appl. No. 15/643,277.
Non-Final Office Action dated Sep. 25, 2023 for U.S. Appl. No. 16/847,032.
Non-Final Office Action dated Sep. 21, 2022 for U.S. Appl. No. 17/100,823.
Non-Final Office Action dated Sep. 23, 2022 for U.S. Appl. No. 16/991,589.
Non-Final Office Action dated Dec. 27, 2023 for U.S. Appl. No. 15/787,291.
Non-Final Office Action dated Jan. 26, 2024 for U.S. Appl. No. 15/787,304.
Notice of Allowance dated Jan. 24, 2024 for U.S. Appl. No. 16/847,032.
Final Office Action dated Mar. 4, 2024 for U.S. Appl. No. 15/643,279.
Final Office Action dated Mar. 14, 2024 for U.S. Appl. No. 16/991,589.
Final Office Action dated Jan. 9, 2024 for U.S. Appl. No. 17/100,823.

\* cited by examiner

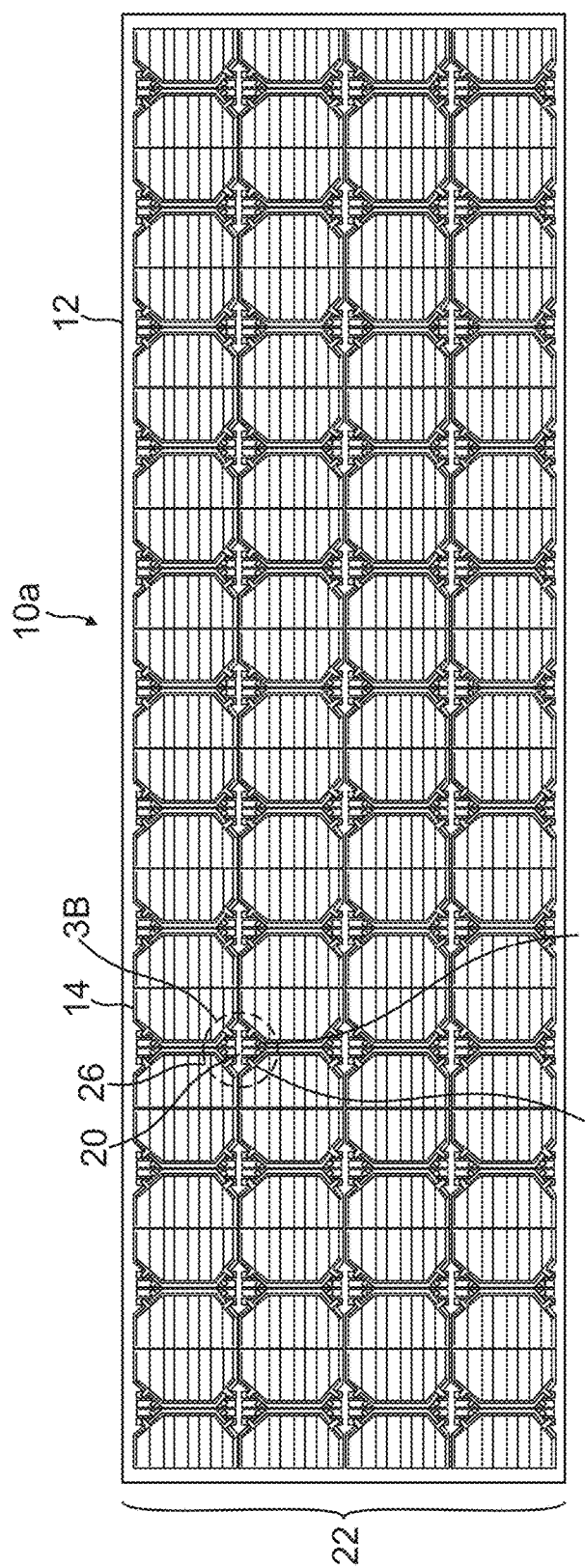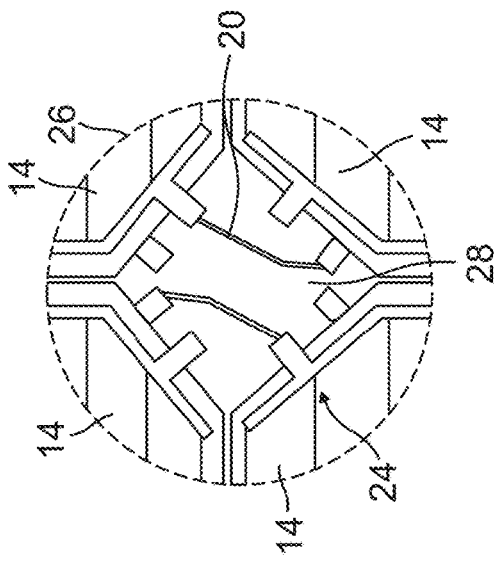
FIG. 3A
FIG. 3B

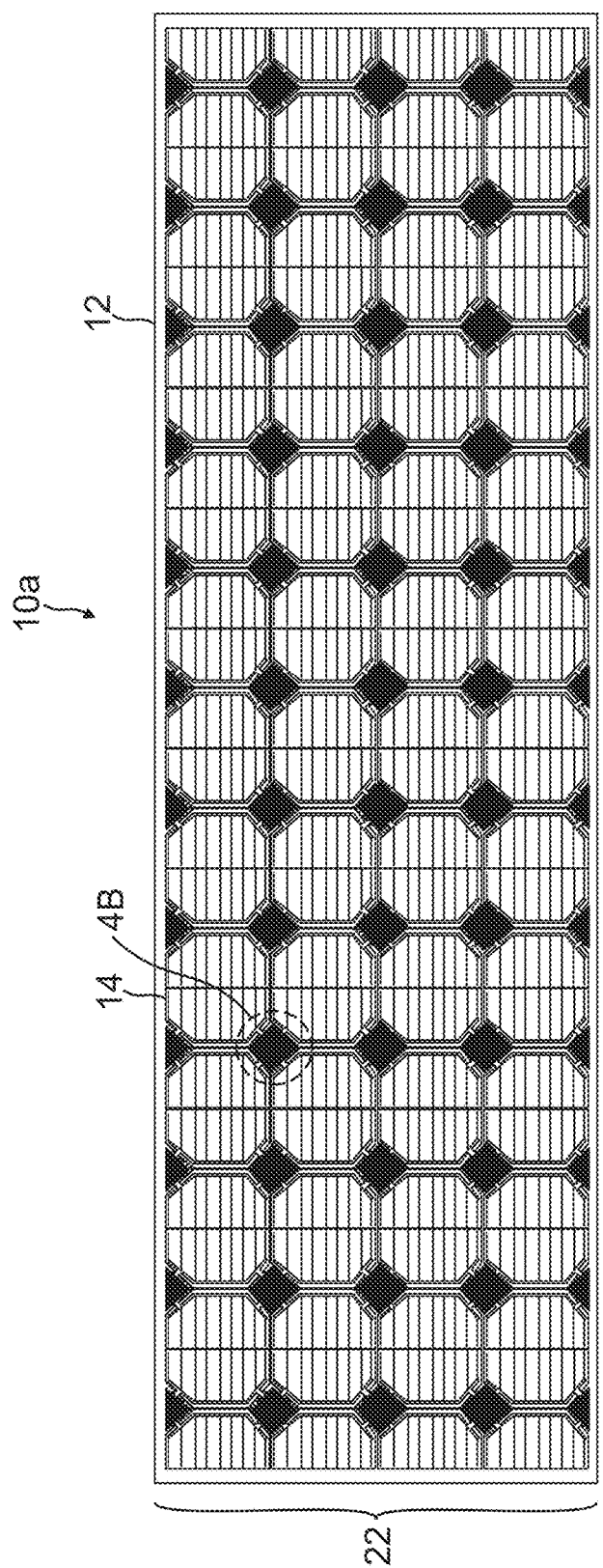
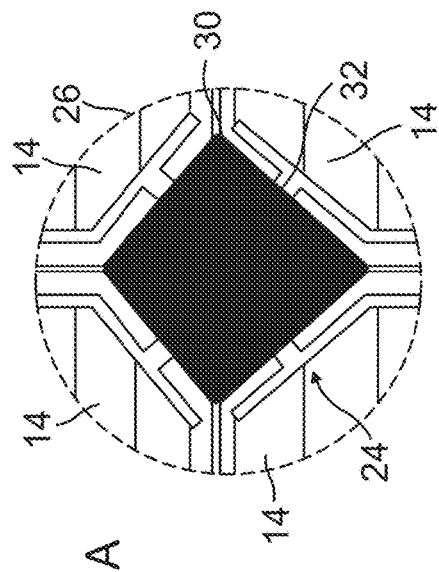
FIG. 4A
FIG. 4B

SOLAR CELLS FOR A SOLAR CELL ARRAY

CROSS REFERENCE TO RELATED APPLICATIONS

This application is a continuation under 35 U.S.C. Section 120 of the following and commonly-assigned application:

U.S. Utility application Ser. No. 15/643,289, filed on Mar. 15, 2018, by Eric Rehder, Philip Chui, Tom Crocker, Daniel Law and Dale Waterman, entitled "SOLAR CELLS FOR A SOLAR CELL ARRAY," now U.S. Pat. No. 11,437,533, issued Sep. 6, 2022;

which application claims the benefit under 35 U.S.C. Section 120 of the following and commonly-assigned applications:

U.S. Utility application Ser. No. 15/643,274, filed on Jul. 6, 2017, by Eric Rehder, entitled "SOLAR CELL ARRAY CONNECTIONS USING CORNER CONDUCTORS,"

U.S. Utility application Ser. No. 15/643,277, filed on Jul. 6, 2017, by Eric Rehder, entitled "PREFABRICATED CONDUCTORS ON A SUBSTRATE TO FACILITATE CORNER CONNECTIONS FOR A SOLAR CELL ARRAY,"

U.S. Utility application Ser. No. 15/643,279, filed Jul. 6, 2017, by Eric Rehder, entitled "REWORK AND REPAIR OF COMPONENTS IN A SOLAR ARRAY,"

U.S. Utility application Ser. No. 15/643,282, filed on Jul. 6, 2017, by Eric Rehder, entitled "POWER ROUTING MODULE FOR A SOLAR ARRAY,"

U.S. Utility application Ser. No. 15/643,285, filed on Jul. 6, 2017, by Eric Rehder, entitled "POWER ROUTING MODULE WITH A SWITCHING MATRIX FOR A SOLAR CELL ARRAY," and U.S. Utility application Ser. No. 15/643,287, filed on Jul. 6, 2017, by Eric Rehder, entitled "NANO-METAL CONNECTIONS FOR A SOLAR CELL ARRAY,"

all of which applications claim the benefit under 35 U.S.C. Section 119(e) of the following and commonly-assigned provisional applications:

U.S. Provisional Application Ser. No. 62/394,636, filed on Sep. 14, 2016, by Eric Rehder, entitled "SOLAR CELL ARRAY CONNECTIONS,"

U.S. Provisional Application Ser. No. 62/394,616, filed on Sep. 14, 2016, by Eric Rehder, entitled "CORNER CONNECTORS FOR A SOLAR CELL ARRAY,"

U.S. Provisional Application Ser. No. 62/394,623, filed on Sep. 14, 2016, by Eric Rehder, entitled "PREFABRICATED CONDUCTORS ON A SUBSTRATE TO FACILITATE CORNER CONNECTIONS FOR A SOLAR CELL ARRAY,"

U.S. Provisional Application Ser. No. 62/394,627, filed on Sep. 14, 2016, by Eric Rehder, entitled "SELECT CURRENT PATHWAYS IN A SOLAR ARRAY,"

U.S. Provisional Application Ser. No. 62/394,629, filed on Sep. 14, 2016, by Eric Rehder, entitled "MULTILAYER CONDUCTORS IN A SOLAR ARRAY,"

U.S. Provisional Application Ser. No. 62/394,632, filed on Sep. 14, 2016, by Eric Rehder, entitled "REWORK AND REPAIR OF COMPONENTS IN A SOLAR ARRAY,"

U.S. Provisional Application Ser. No. 62/394,649, filed on Sep. 14, 2016, by Eric Rehder, entitled "POWER ROUTING MODULE FOR A SOLAR ARRAY,"

U.S. Provisional Application Ser. No. 62/394,666, filed on Sep. 14, 2016, by Eric Rehder, entitled "POWER ROUTING MODULE WITH A SWITCHING MATRIX FOR A SOLAR CELL ARRAY,"

U.S. Provisional Application Ser. No. 62/394,667, filed on Sep. 14, 2016, by Eric Rehder, entitled "NANO-METAL CONNECTIONS FOR A SOLAR CELL ARRAY,"

U.S. Provisional Application Ser. No. 62/394,671, filed on Sep. 14, 2016, by Eric Rehder, entitled "BACK CONTACTS FOR A SOLAR CELL ARRAY,"

U.S. Provisional Application Ser. No. 62/394,641, filed on Sep. 14, 2016, by Eric Rehder, entitled "PRINTED CONDUCTORS IN A SOLAR CELL ARRAY," and U.S. Provisional Application Ser. No. 62/394,672, filed on Sep. 14, 2016, by Eric Rehder, Philip Chiu, Tom Crocker and Daniel Law, entitled "SOLAR CELLS FOR A SOLAR CELL ARRAY,"

all of which applications are incorporated by reference herein.

BACKGROUND INFORMATION

1. Field

The disclosure is related generally to solar cell panels and, more specifically, to solar cells for a solar cell array.

2. Background

Typical spaceflight-capable solar cell panel assembly involves building long strings of solar cells. These strings are variable in length and can be very long, for example, up to and greater than 20 cells. Assembling such long, variable, and fragile materials is difficult, which has prevented automation of the assembly.

Existing solutions use solar cells assembled into CIC (cell, interconnect and coverglass) units. The CIC has metal foil interconnects connected to the front of the cell that extend in parallel from one side of the CIC. The CICs are located close to each other and the interconnects make connection to the bottom of an adjacent cell. Using these interconnects, the CICs are assembled into linear strings. These linear strings are built-up manually and then laid out to form a large solar cell array comprised of many strings of variable length.

Additionally, a bypass diode is used to protect the cells from reverse bias, when the cells become partially shadowed. The bypass diode generally connects the back contacts of two adjacent cells within the solar cell array.

When used in a satellite, the solar cell array is typically packaged as a panel. The dimensions of the panel are dictated by the needs of the satellite, including such constraints as needed power, as well as the size and shape necessary to pack and store the satellite in a launch vehicle. Furthermore, the deployment of the panel often requires that some portions of the panel are used for the mechanical fixtures and the solar cell array must avoid these locations. In practice, the panel is generally rectangular, but its dimensions and aspect ratio vary greatly. The layout of the CICs and strings to fill this space must be highly customized for maximum power generation, which results in a fabrication process that is highly manual.

What is needed, then, is a means for promoting automated manufacturing of solar arrays, while preserving the ability for customization of solar cell arrays.

SUMMARY

The devices and methods of the present disclosure are embodied in many ways, including, but not limited to, the following examples listed below.

1. A solar cell with one or more grids on a surface thereof, wherein electrical connections are made to the grids in a plurality of locations positioned around a plurality of sides of the solar cell.

2. The electrical connections are connected to conductors on a substrate.

3. The conductors on the substrate distribute current between front or rear connections of the solar cell to a next series-connected solar cell or string termination conductor.

4. The conductors are located under the solar cell.

5. The conductors comprise loops.

6. At least one of the conductors located under the solar cell has two substantially linear portions connected by an arcuate portion, where the linear portions are substantially parallel to each other.

7. The conductors located under the solar cell are parallel to a direction of current flow.

8. The electrical connections comprise series connections to one or more other solar cells.

9. The electrical connections comprise string termination connections to one or more output conducting lines.

10. The plurality of locations comprises at least three locations.

11. Conductors located under the solar cell distribute current to the at least three locations.

12. The solar cell comprises a full solar cell.

13. The full solar cell has four cropped corners and current is distributed to the electrical connections in the cropped corners.

14. There are a plurality of series connection between the solar cells.

15. There is a bypass diode located along one or more of the series connections.

DRAWINGS

Referring now to the drawings in which like reference numbers represent corresponding parts throughout:

FIGS. 3A and 3B illustrate an improved structure for a solar cell panel, according to one example.

FIGS. 4A and 4B illustrate an alternative structure for the solar cell panel, according to one example.

Figure 23:
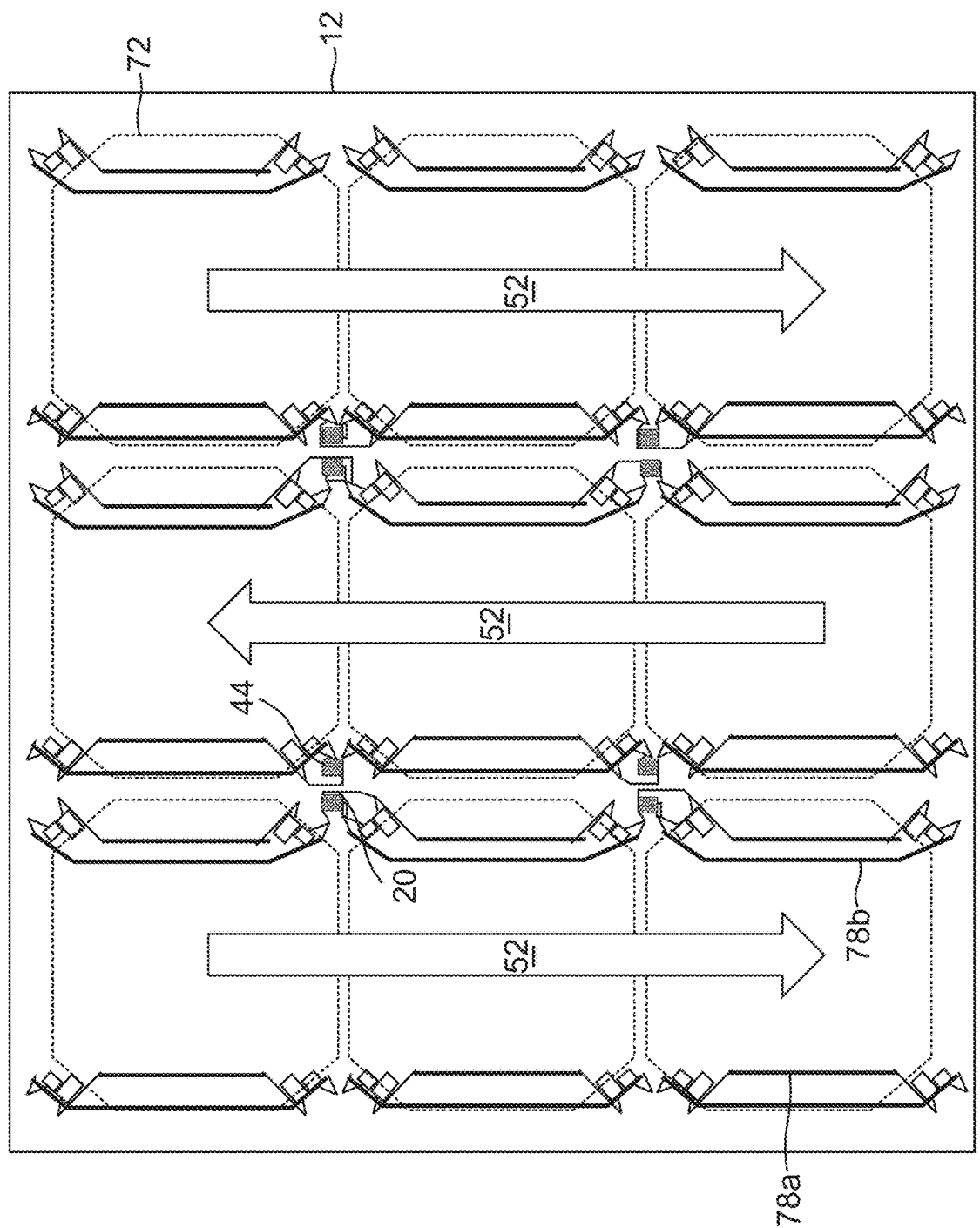

FIG. 23 also illustrates a variation in the configuration of buried conductors in the substrate.

Figure 24:
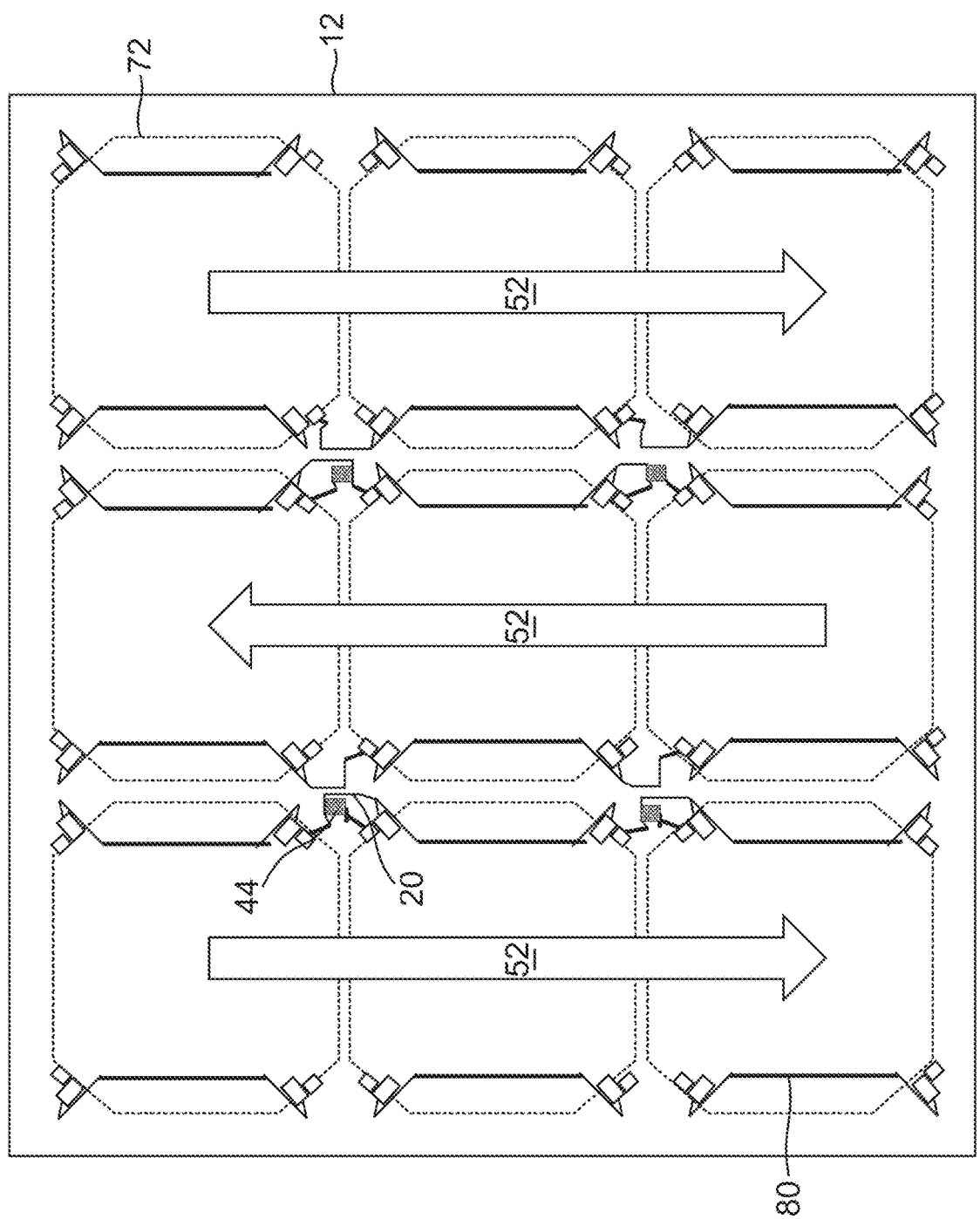

FIG. 24 illustrates another variation in the buried conductors in the substrate.

Figure 25:
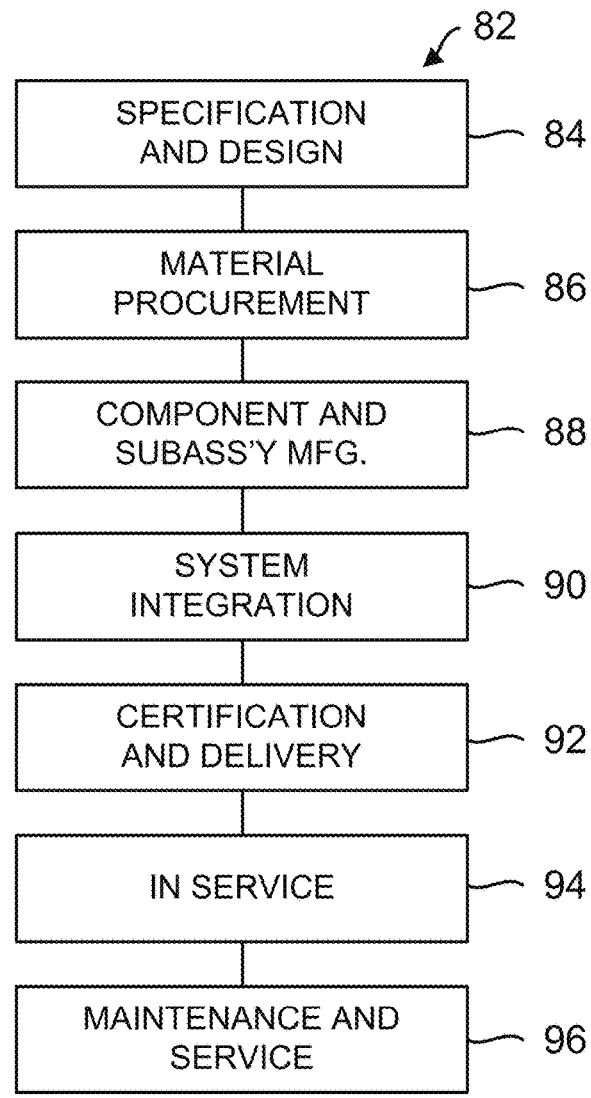

FIG. 25 describes a method of fabricating a solar cell, solar cell panel and/or satellite, according to one example.

Figure 26:
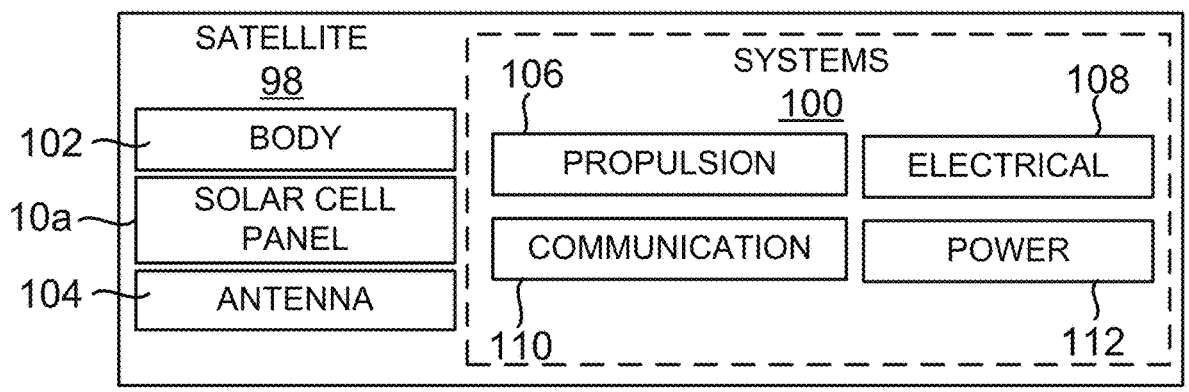

FIG. 26 illustrates a resulting satellite having a solar cell panel comprised of solar cells, according to one example.

Figure 27:
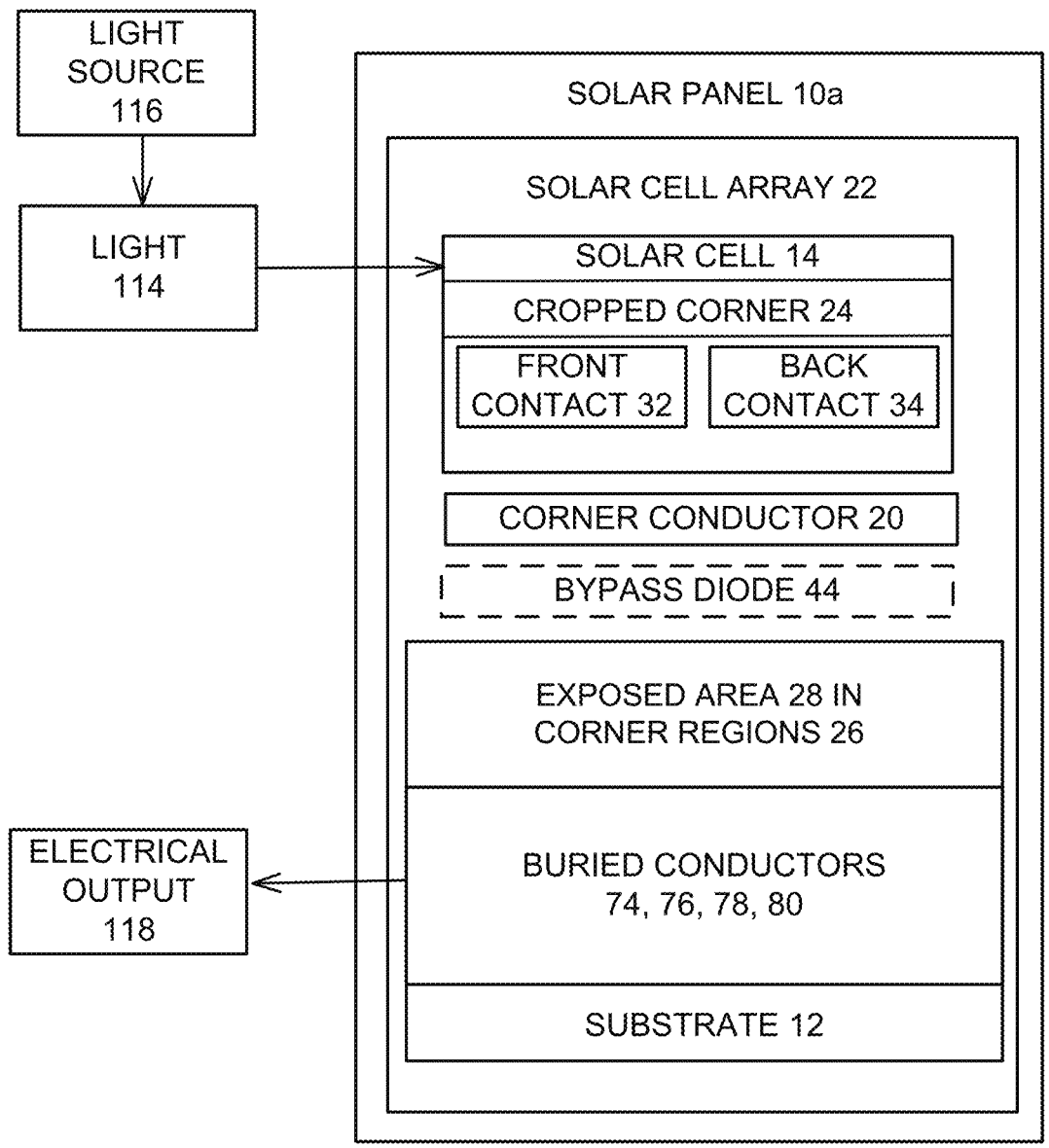

FIG. 27 is an illustration of the solar cell panel in the form of a functional block diagram, according to one example.

DETAILED DESCRIPTION

In the following description, reference is made to the accompanying drawings which form a part hereof, and in which is shown by way of illustration a specific example in which the disclosure may be practiced. It is to be understood that other examples may be utilized and structural changes may be made without departing from the scope of the present disclosure.

A new approach to the design of solar cell arrays, such as those used for spaceflight power applications, is based on electrical connections among the solar cells in the array.

This new approach rearranges the components of a solar cell and the arrangements of the solar cells in the array. Instead of having solar cells connected into long linear strings and then assembled onto a substrate, the solar cells are attached individually to a substrate, such that corner regions of adjacent cells are aligned on the substrate, thereby exposing an area of the substrate. Electrical connections between cells are made by corner conductors formed on or in the substrate in these corner regions. Consequently, this approach presents a solar cell array design based on individual cells.

Thus, a single laydown process and layout can be used in the fabrication of solar cell arrays. Current flow between solar cells will be assisted with conductors embedded in the substrate. These electrical connections define the specific characteristics of the solar cell array, such as its dimensions, stayout zones, and circuit terminations. This approach simplifies manufacturing, enables automation, and bottoms costs and delivery times.

Figure 1:
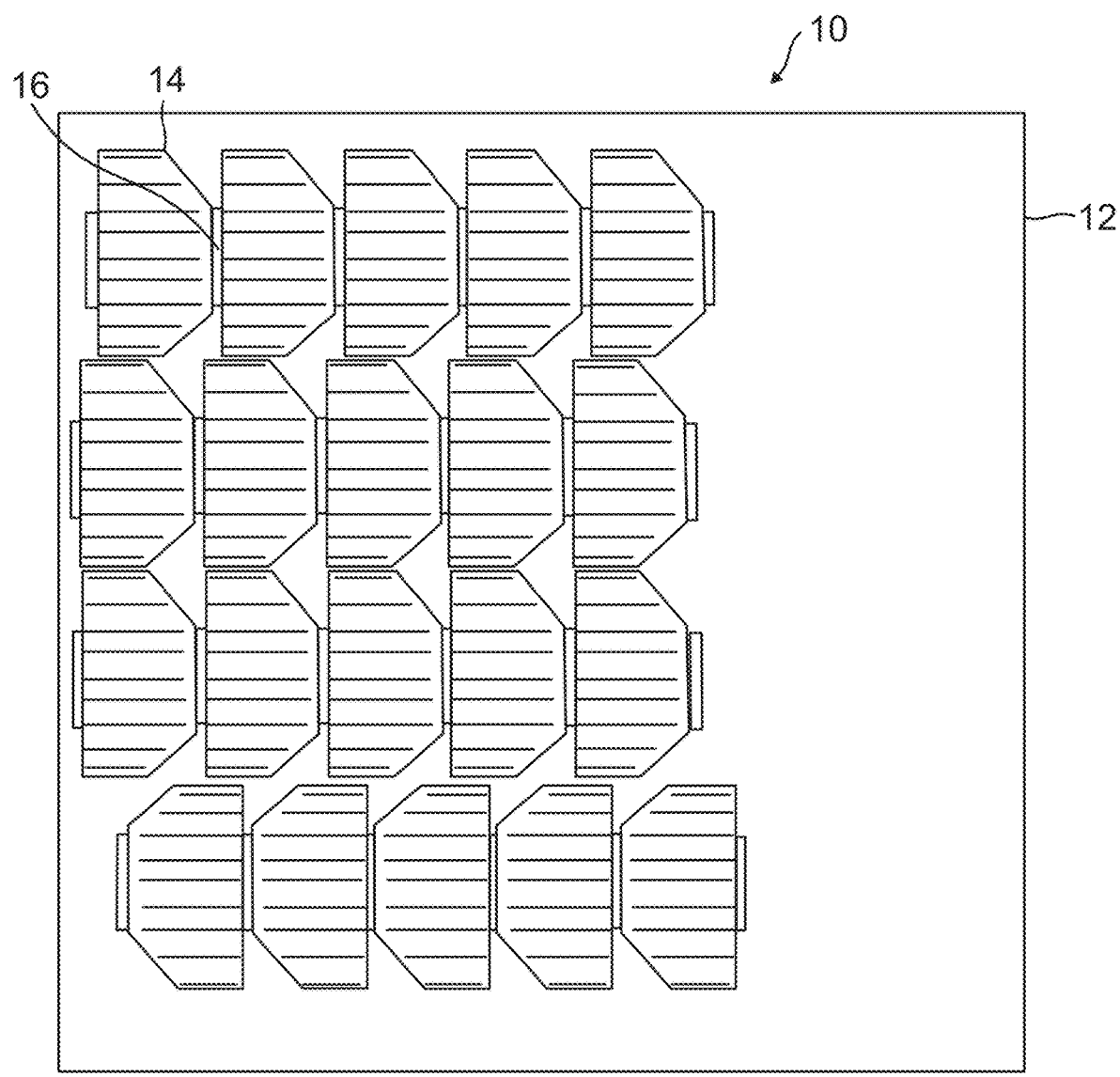
FIGS. 1 and 2 illustrate conventional structures for solar cell panels.
Figure 2:
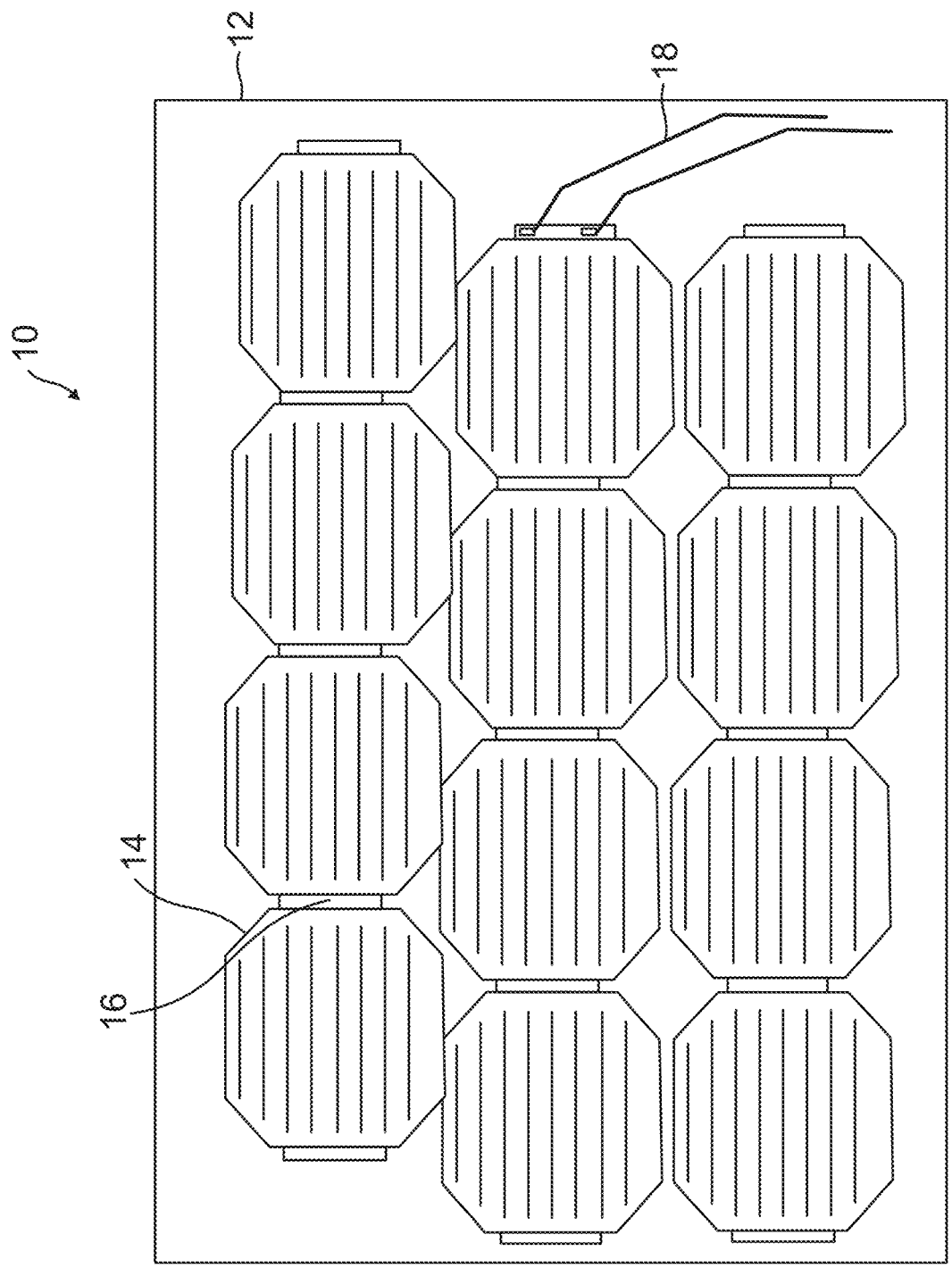

FIGS. 1 and 2 illustrate conventional structures for solar cell panels 10, which include a substrate 12, a plurality of solar cells 14 arranged in an array, and electrical connectors 16 between the solar cells 14. Half size solar cells 14 are shown in FIG. 1 and full size solar cells 14 are shown in FIG. 2. Space solar cells 14 are derived from a round Germanium (Ge) substrate starting material, which is later fabricated into semi-rectangular shapes to improve dense packing onto the solar cell panel 10. This wafer is often diced into one or two solar cells 14 herein described as half size or full size solar cells 14. The electrical connectors 16 providing electrical connections between solar cells 14 are made along the long parallel edge between solar cells 14. These series connections (cell-to-cell) are completed off-substrate, as strings of connected solar cells 14 are built having lengths of any number of solar cells 14. The completed strings of solar cells 14 are then applied and attached to the substrate 12.

In FIG. 2, wiring 18 is attached at the end of a string of solar cells 14 to electrically connect the string to other strings, or to terminate the resulting circuit and bring the current off of the array of solar cells 14. String-to-string and circuit termination connections are typically done on the substrate 12, and typically using wiring 18. However, some small solar cell panels 10 use a printed circuit board (PCB)-type material with embedded conductors.

Adjacent strings of connected solar cells 14 can run parallel or anti-parallel. In addition, strings of connected solar cells 14 can be aligned or misaligned. There are many competing influences to the solar cell 14 layout resulting in regions where solar cells 14 are parallel or anti-parallel, aligned or misaligned.

FIGS. 3A-3B illustrate improved devices and structures for a solar cell panel 10a, according to one example, wherein FIG. 3B is an enlarged view of the details in the dashed circle in FIG. 3A. The various components of the solar cell panel 10a are shown and described in greater detail in FIGS. 5-14.

The solar cell panel 10a includes a substrate 12 for solar cells 14 having one or more corner conductors 20 thereon. In one example, the substrate 12 is a multi-layer substrate 12 comprised of one or more Kapton® (polyimide) layers separating one or more patterned metal layers. The substrate 12 may be mounted on a large rigid panel 10a similar to conventional assembles. Alternatively, substrate 12 can be mounted to a lighter more sparse frame or panel 10a for mounting or deployment.

A plurality of solar cells 14 are attached to the substrate 12 in a two-dimensional (2D) grid of an array 22. In this example, the array 22 is comprised of ninety-six (96) solar cells 14 arranged in four (4) rows by twenty-four (24) columns, but it is recognized that any number of solar cells 14 may be used in different implementations. Alternatively, the array 22 could be comprised of forty-eight (48) full-size solar cells 14 arranged in four (4) rows by twelve (12) columns, wherein each of the full-size solar cells 14 is configured in a manner similar to two half-size solar cells 14 arranged back-to-back (see, e.g., FIGS. 16-24 below).

At least one of the solar cells 14 has at least one cropped corner 24 that defines a corner region 26, as indicated by the dashed circle. The solar cells 14 are attached to the substrate 12, such that corner regions 26 of adjacent ones of the solar cells 14 are aligned, thereby exposing an area 28 of the substrate 12. The area 28 of the substrate 12 that is exposed includes one or more of the corner conductors 20, and one or more electrical connections between the solar cells 14 and the corner conductors 20 are made in the corner regions 26 resulting from the cropped corners 24 of the solar cells 14.

The corner conductors 20 are conductive paths attached to, printed on, buried in, or deposited on the substrate 12, before and/or after the solar cells 14 are attached to the substrate 12, which facilitate connections between adjacent solar cells 14. The connections between the solar cells 14 and the corner conductors 20 are made after the solar cells 14 have been attached to the substrate 12.

In one example, four adjacent solar cells 14 are aligned on the substrate 12, such that four cropped corners 24, one from each solar cell 14, are brought together at the corner regions 26. The solar cells 14 are then individually attached to the substrate 12, wherein the solar cells 14 are placed on top of the corner conductors 20 to make the electrical connection between the solar cells 14 and the corner conductors 20.

The solar cells 14 may be applied to the substrate 12 as CIC (cell, interconnect and coverglass) units. Alternatively, a bare solar cell 14 may be applied to the substrate 12, and the coverglass later applied to the front of the solar cell 14 with a transparent adhesive. This assembly protects the solar cells 14 from damage from space radiation that would limit performance.

FIGS. 4A and 4B illustrate an alternative structure for the solar cell panel 10a, according to one example, wherein FIG. 4B is an enlarged view of the details in the dashed circle in FIG. 4A. In this example, only a few corner conductors 20 are printed on or integrated with the substrate 12. Instead, most of the corner conductors 20 are contained within a power routing module (PRM) 30 that is bonded to the substrate 12.

Figure 5:
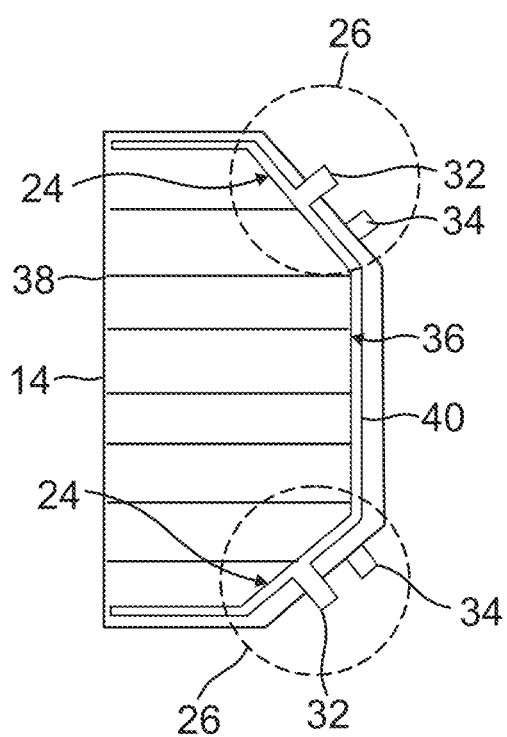
FIG. 5 illustrates the front side of an exemplary solar cell that may be used in the improved solar cell panel of FIGS. 3A-3B and 4A-4B.

FIG. 5 illustrates the front side of an exemplary solar cell 14 that may be used in the improved solar cell panel 10a of FIGS. 3A-3B and 4A-4B. The solar cell 14, which is a CIC unit, is a half-size solar cell 14. (Full-size solar cells 14 could also be used.)

The solar cell 14 is fabricated having at least one cropped corner 24 that defines a corner region 26, as indicated by the dashed circle, such that the corner region 26 resulting from the cropped corner 24 includes at least one contact 32, 34 for making an electrical connection to the solar cell 14. In the example of FIG. 5, the solar cell 14 has two cropped corners 24, each of which has both a front contact 32 on the front side of the solar cell 14 and a back contact 34 on a back side of the solar cell 14, where the contacts 32 and 34 extend into the corner region 26. (Full-size solar cells 14 would have four cropped corners 24, each of which would have a front contact 32 and a back contact 34.)

The cropped corners 24 increase utilization of the round wafer starting materials for the solar cells 14. In conventional panels 10, these cropped corners 24 would result in unused space on the panel 10 after the solar cells 14 are attached to the substrate 12. The new approach described in this disclosure, however, utilizes this unused space. Specifically, metal foil interconnects, comprising the corner conductors 20, front contacts 32 and back contacts 34, are moved to the corner regions 26. In contrast, existing CICs have interconnects attached to the solar cell 14 front side, and connect to the back side (where connections occur) during stringing.

The current generated by the solar cell 14 is collected on the front side of the solar cell 14 by one or more grids 36 comprised of thin metal fingers 38 and wide bus bars 40 that are connected to both of the front contacts 32. There is a balance between the addition of metal in the grid 36, which reduces the light entering the solar cell 14 and its output power, and the reduced resistance of having more metal. The bus bar 40 is a low resistance conductor that carries high currents and also provides redundancy should a front contact 32 become disconnected. Optimization generally desires a short bus bar 40 running directly between the front contacts 32. Having the front contact 32 in the cropped corner 24 results in moving the bus bar 40 away from the perimeter of the solar cell 14. This is achieved while simultaneously minimizing the bus bar 40 length and light obscuration. Additionally, the fingers 38 are now shorter. This reduces parasitic resistances in the grid 36, because the length of the fingers 38 is shorter and the total current carried is less. This produces a design preference where the front contacts 32 and connecting bus bar 40 is moved to provide shorter narrow fingers 38.

Figure 6:
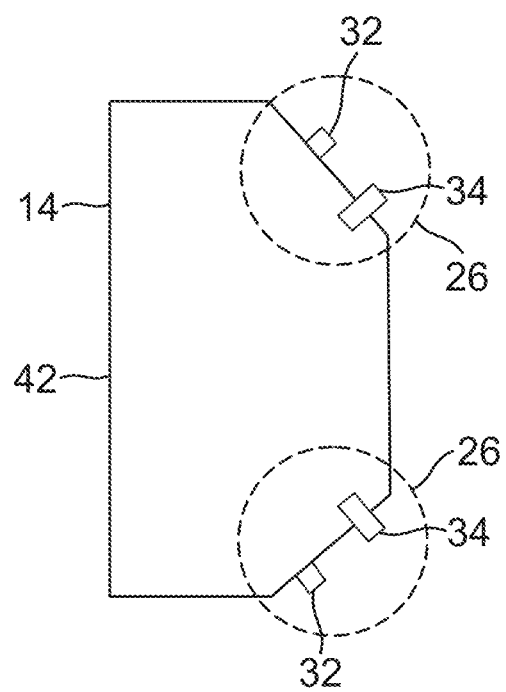
FIG. 6 illustrates the back side of the exemplary solar cell of FIG. 5.

FIG. 6 illustrates the back side of the exemplary solar cell 14 of FIG. 5. The back side of the solar cell 14 is covered by a full area metal back layer 42 that is connected to both of the back contacts 34.

Figure 7:
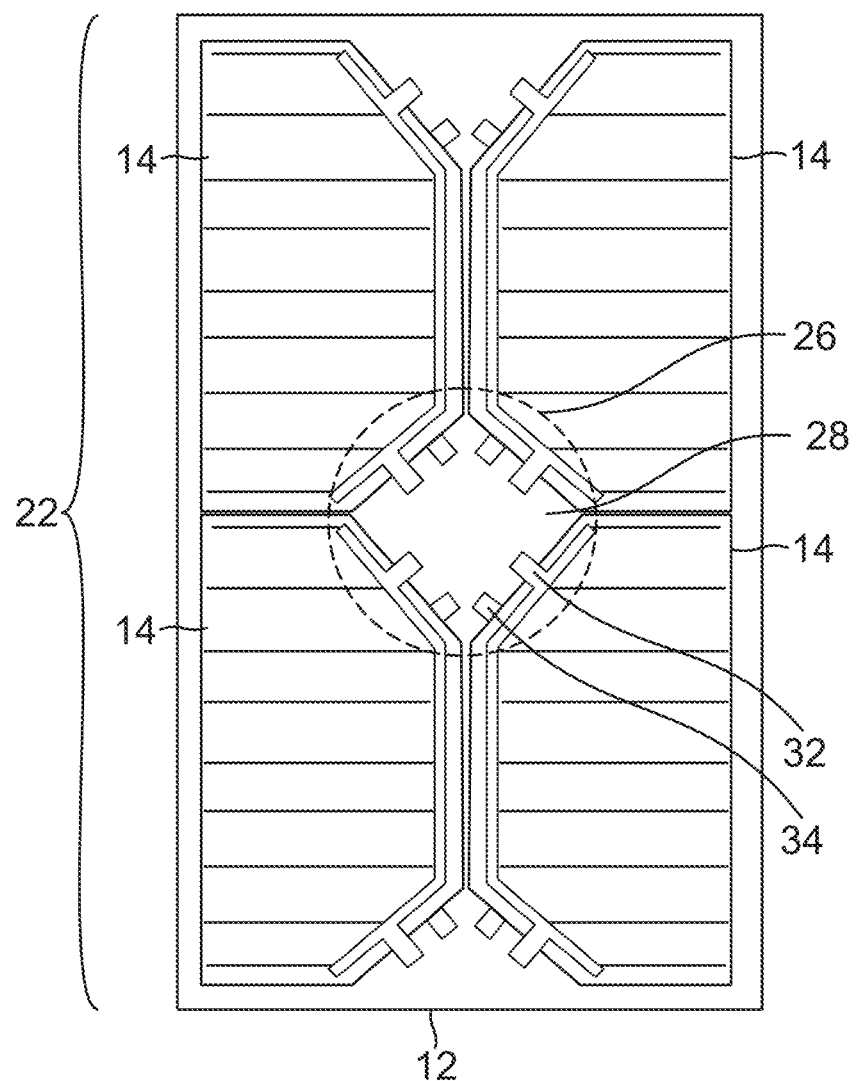
FIG. 7 illustrates cells arranged into a two-dimensional (2D) grid of an array, according to one example.

FIG. 7 illustrates solar cells 14 arranged into the 2D grid of the array 22, according to one example. The array 22 comprises a plurality of solar cells 14 attached to a substrate 12, such that corner regions 26 of adjacent ones of the solar cells 14 are aligned, thereby exposing an area 28 of the substrate 12. Electrical connections (not shown) between the solar cells 14 are made in the exposed area 28 of the substrate 12 using the front contacts 32 and back contacts 34 of the solar cells 14 and corner conductors 20 (not shown) formed on or in the exposed area 28 of the substrate 12.

During assembly, the solar cells 14 are individually attached to the substrate 12. This assembly can be done directly on a support surface, i.e., the substrate 12, which can be either rigid or flexible. Alternatively, the solar cells 14 could be assembled into the 2D grid of the array 22 on a temporary support surface and then transferred to a final support surface, i.e., the substrate 12.

Figure 8:
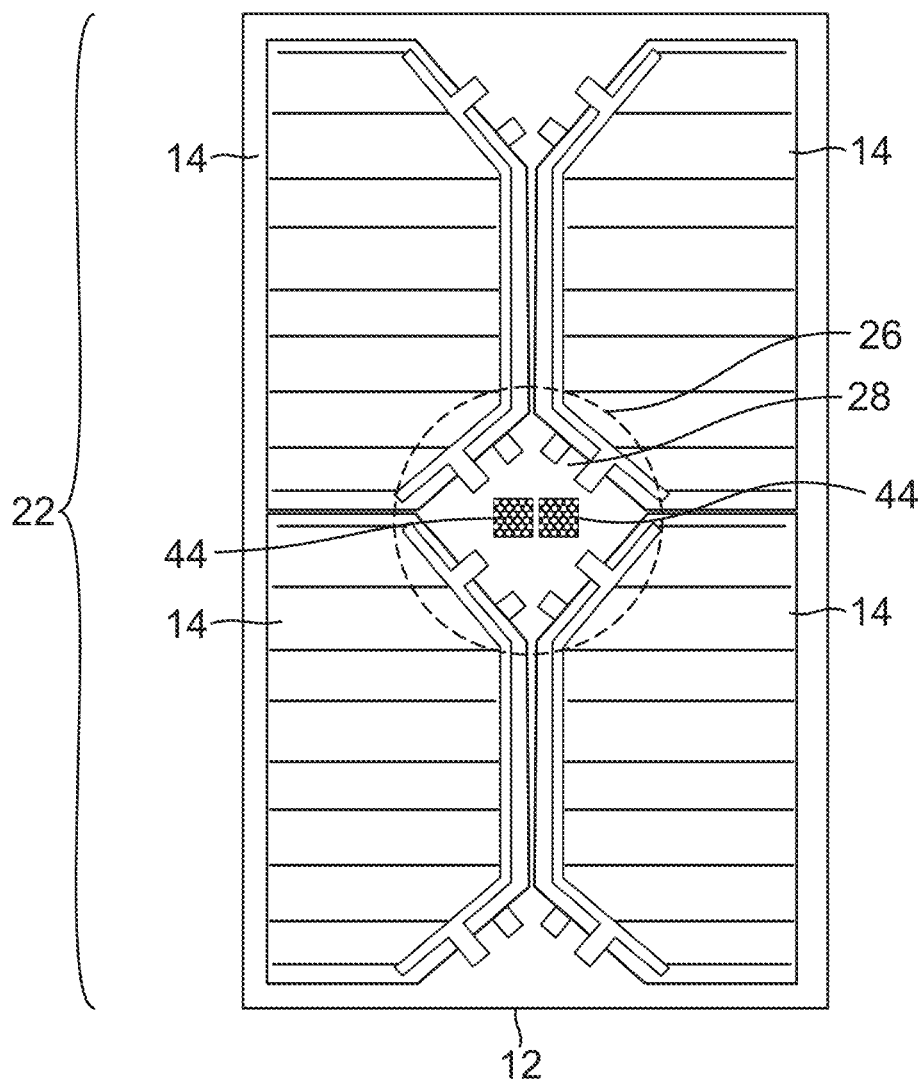
FIG. 8 illustrates an example of the array where one or more bypass diodes are added to the exposed area of the substrate in the corner regions.

FIG. 8 illustrates an example of the array 22 where one or more bypass diodes 44 are added to the exposed area 28 of the substrate 12 in the corner regions 26, for use in one or more of the electrical connections. The bypass diodes 44 protect the solar cells 14 when the solar cells 14 become unable to generate current, which could be due to being partially shadowed, which drives the solar cells 14 into reverse bias. In one example, the bypass diodes 44 are attached to the substrate 12 in the corner regions 26 independent of the solar cells 14.

Figure 9:
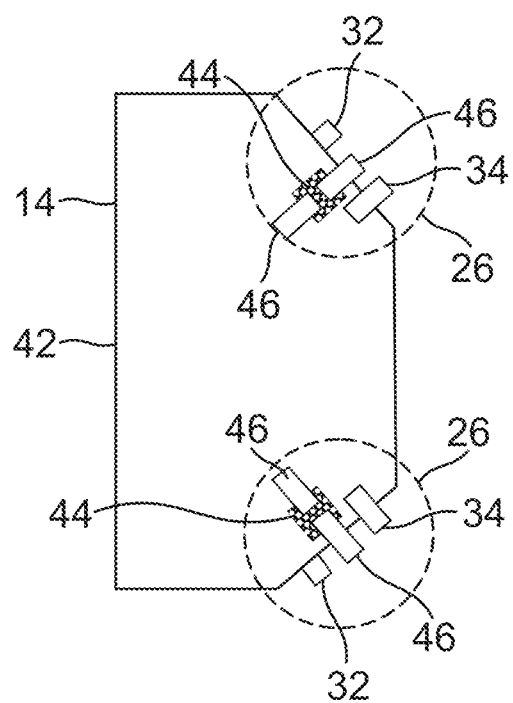
FIG. 9 illustrates an example where the bypass diode is applied to the back side of the cell, with an interconnect or contact for the bypass diode extending into the corner region between front and back contacts.

FIG. 9 illustrates an example where the bypass diode 44 is applied to the back side of the solar cell 14, with an interconnect or contact 46 for the bypass diode 44 extending into the corner region 26 between the front and back contacts 32, 34.

Figure 10:
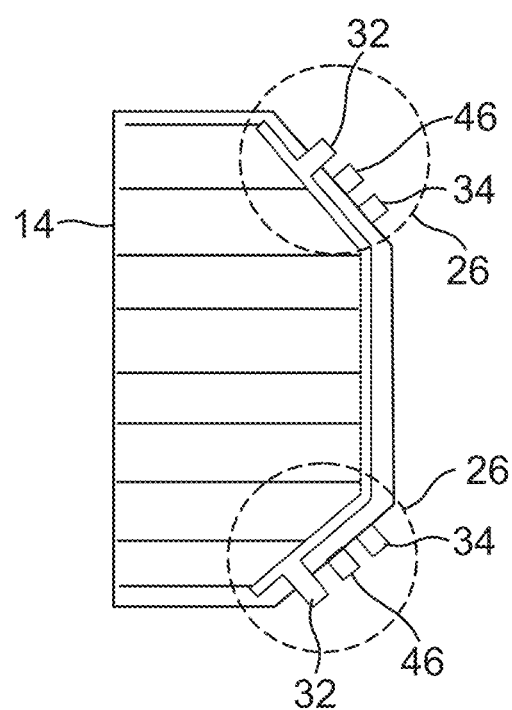
FIG. 10 illustrates a front side view of the example of FIG. 9, with the interconnect or contact for the bypass diode extending into the corner region between the front and back contacts.

FIG. 10 illustrates a front side view of the example of FIG. 9, with the interconnect or contact 46 for the bypass diode 44 (not shown) extending into the corner region 26 between the front and back contacts 32, 34.

Figure 11:
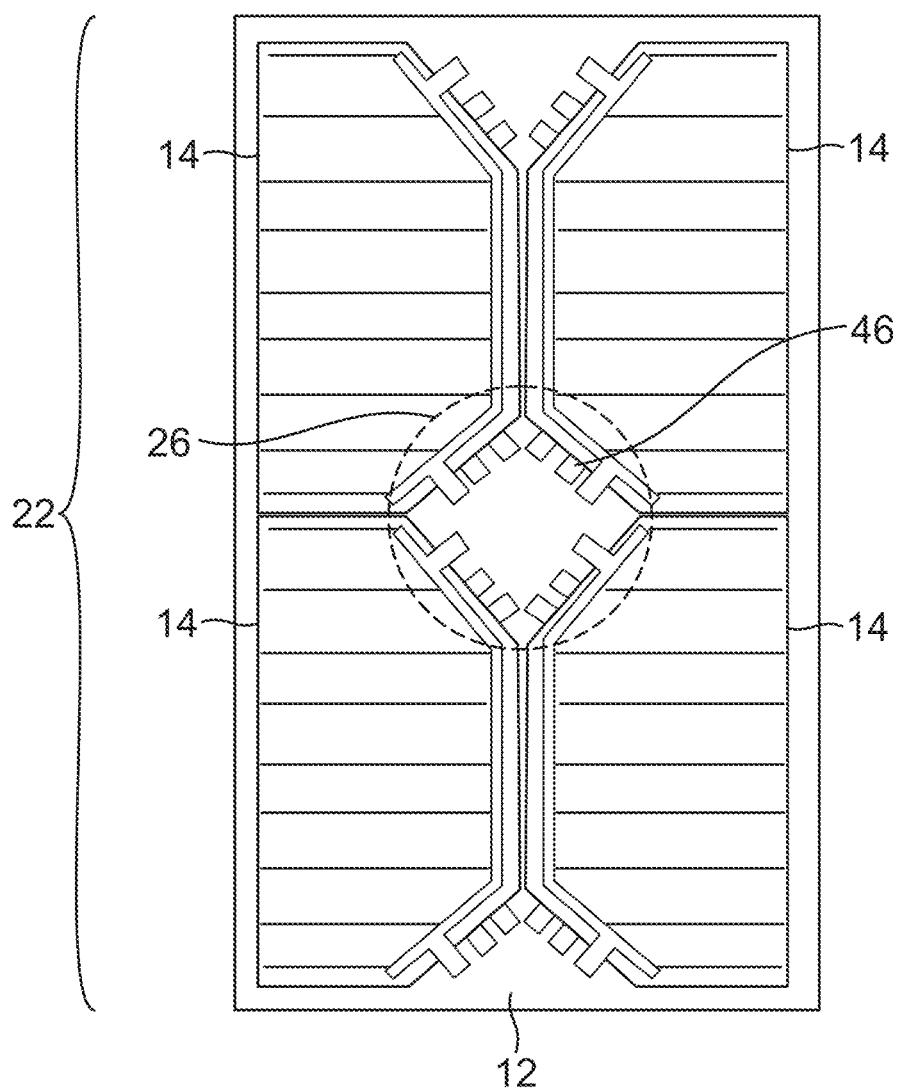
FIG. 11 illustrates the cells of FIGS. 9 and 10 arranged into the 2D grid of the array and applied to the substrate, where the bypass diodes are applied to the back side of the cells, with the contacts for the bypass diodes extending into the corner regions of the cells.

FIG. 11 illustrates the solar cells 14 of FIGS. 9 and 10 arranged into the 2D grid of the array 22 and applied to the substrate 12, where the bypass diodes 44 (not shown) are applied to the back side of the solar cells 14, with the contacts 46 for the bypass diodes 44 extending into the corner regions 26 of the solar cells 14.

One advantage of this approach is that the layouts illustrated in FIGS. 7, 8 and 11 are generalized layouts. Specifically, these layouts can be repeated across any panel 10a dimensions desired by a customer. This greatly simplifies assembly, rework, test, and inspection processes.

Following solar cell 14 and bypass diode 44 placement, there is another step where customization is accomplished. The front contacts 32 and back contacts 34 in the corner regions 26 of the solar cells 14 must be connected. This can be done in many combinations in order to route current through a desired path.

After attaching solar cells 14 to the substrate 12, connections are made between the solar cells 14 and the corner conductors 20. Front and back contacts 32, 34 of the solar cells 14 are present in each corner region 26 for attachment to the corner conductors 20. Interconnects for the front and back contacts 32, 34 of each of the solar cells 14 are welded, soldered, or otherwise bonded onto the corner conductors 20 to provide a conductive path 20, 32, 34 for routing current out of the solar cells 14.

Using the corner conductors 20, any customization can be made in the electrical connections. Adjacent solar cells 14 can be electrically connected to flow current in up/down or left/right directions as desired by the specific design. Current flow can also be routed around stayout zones as needed. The length or width of the solar cell array 22 can be set as desired. Also, the width can vary over the length of the array 22.

Figure 12:
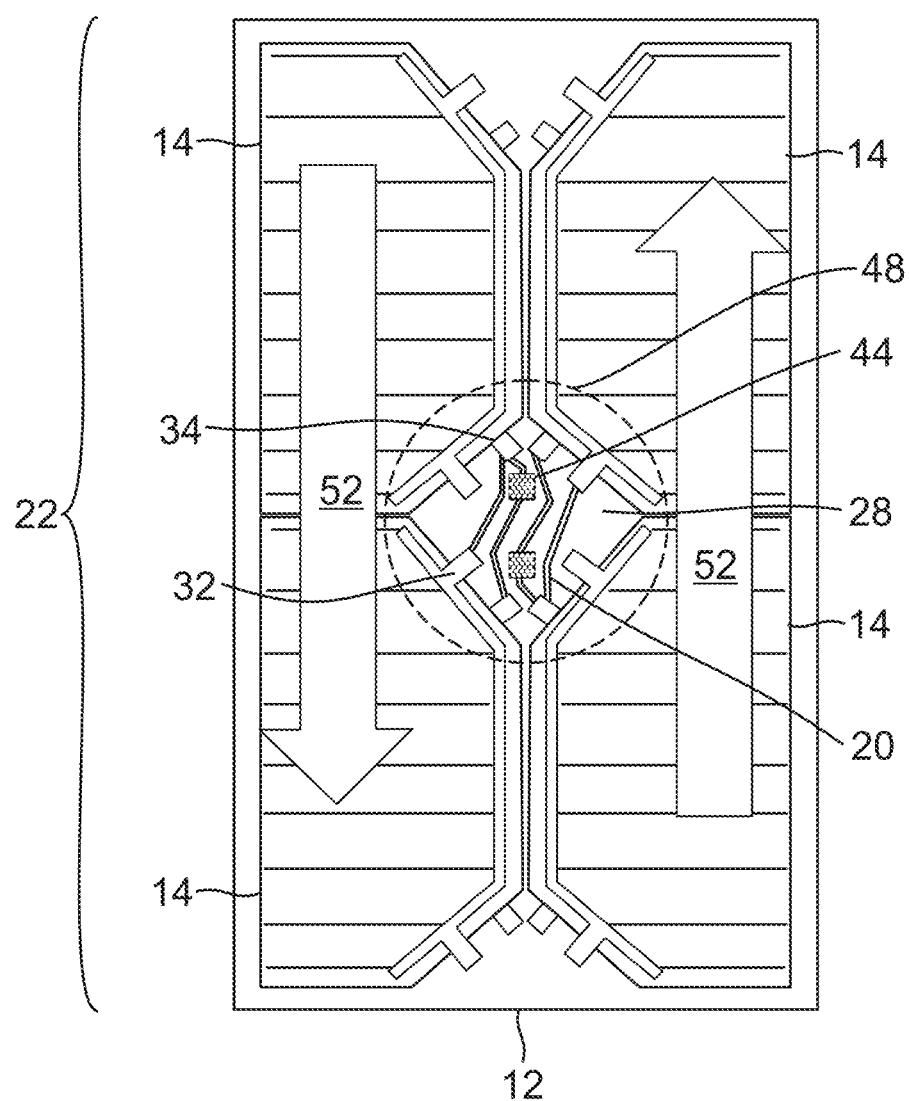
FIG. 12 shows up/down series connections between the cells of the array, according to one example.
Figure 13:
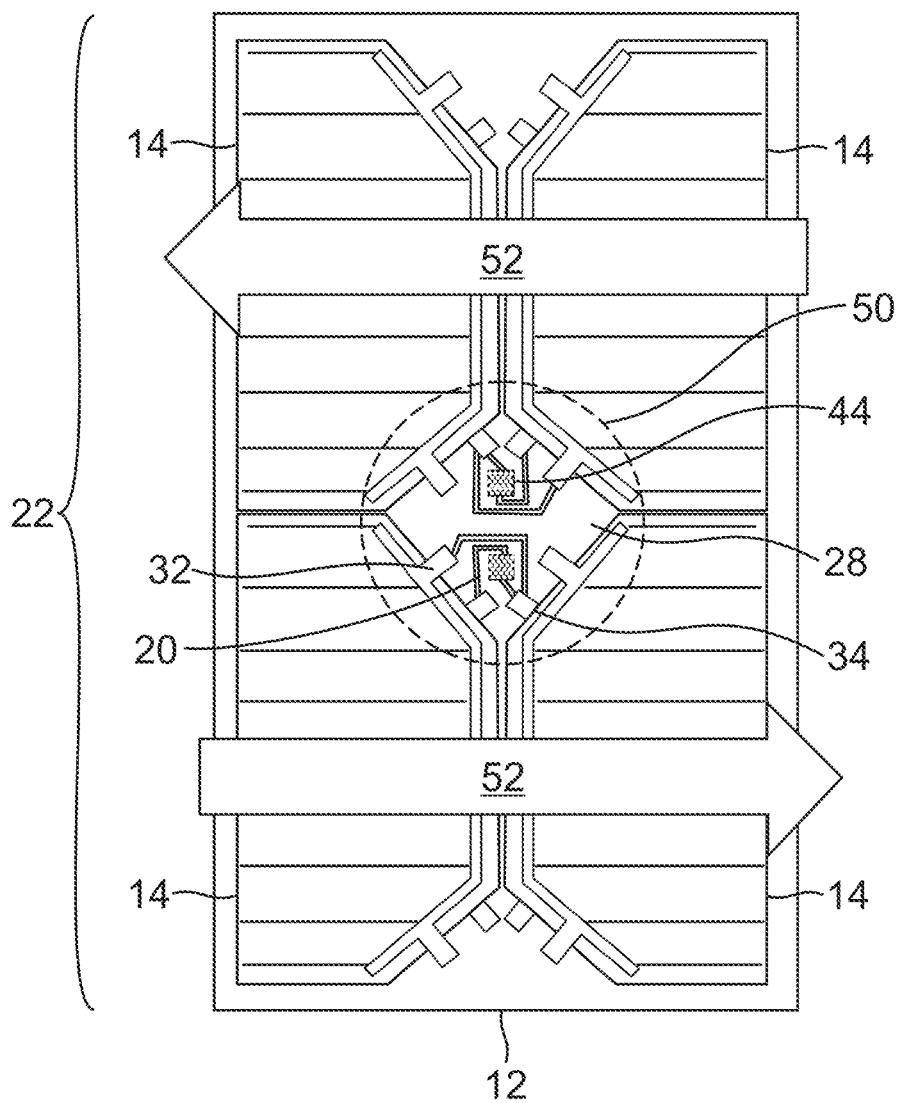
FIG. 13 shows left/right series connections between the cells of the array, according to one example.

In one example, the electrical connections are series connections that determine a flow of current through the plurality of solar cells 14. This may be accomplished by the connection schemes shown in FIGS. 12 and 13, wherein FIG. 12 shows up/down series connections 48 between the solar cells 14 of the array 22, and FIG. 13 shows left/right series connections 50 between the solar cells 14 of the array 22. In both FIGS. 12 and 13, these series connections 48, 50 are electrical connections between the front contacts 32 and back contacts 34 of the solar cells 14, and the bypass diodes 44, are made using the corner conductors 20 formed on or in the exposed areas 28 of the substrate 12. These series connections 48, 50 determine the current (power) flow, as indicated by the arrows 52, through the solar cells 14, in contrast to the assembly of large strings off-substrate.

The corner conductors 20 between solar cells 14 can be in many forms. They could be accomplished using wires that have electrical connections made on both ends, which could be from soldering, welding, conducting adhesive, or other process. In addition to wires, metal foil connectors, similar to the interconnects, could be applied. Metal conductive paths or traces (not shown) can also be integrated with the substrate 12, as in a flex sheet assembly or PCB.

Figure 14:
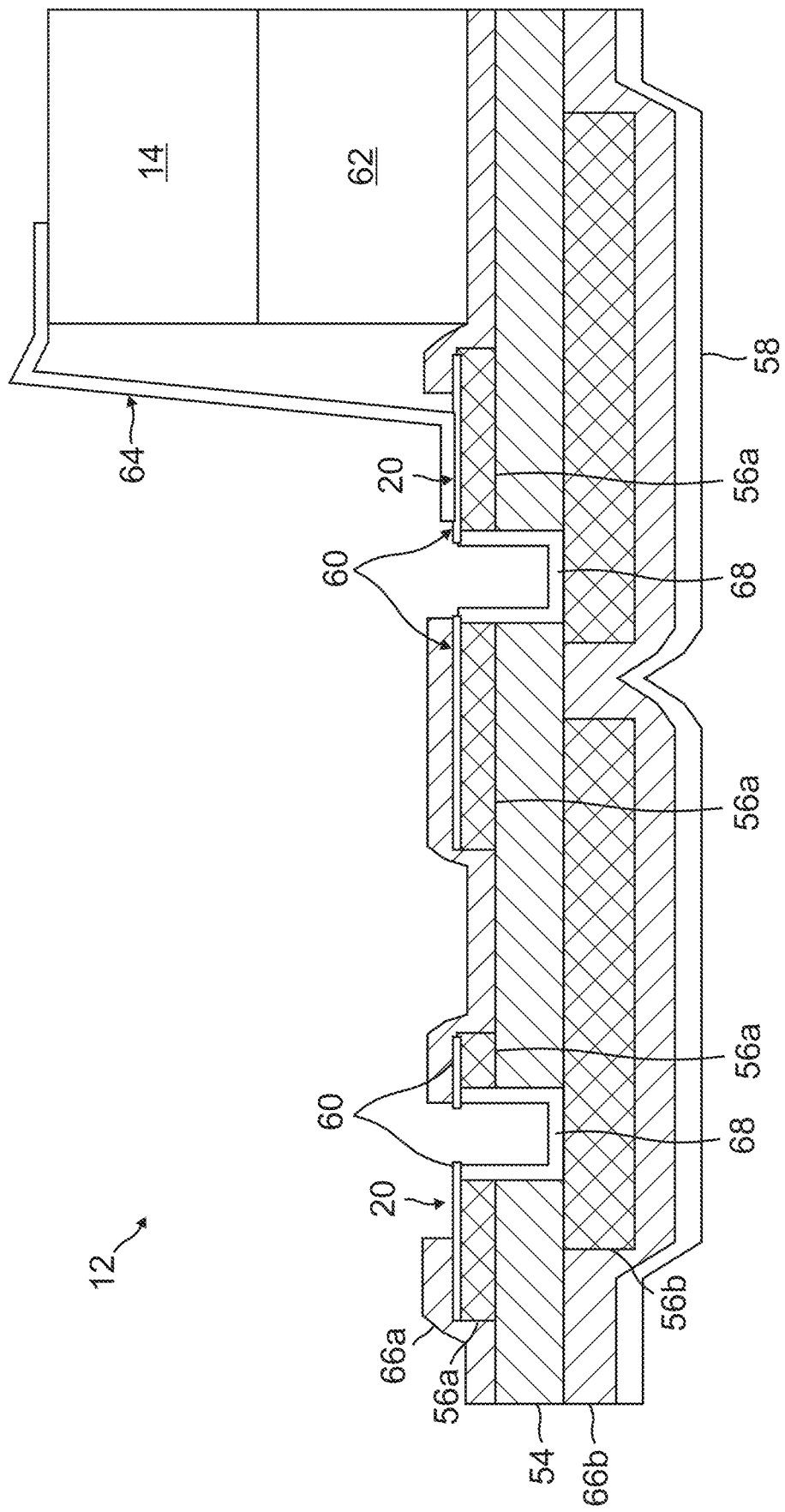
FIG. 14 shows a side view of an example wherein the substrate is a flex sheet assembly, according to one example.

FIG. 14 shows a side view of an example wherein the substrate 12 is a flex sheet assembly including multilayer conductors. The substrate 12 includes a polyimide base layer 54 with Cu layer 56a above and Cu layer 56b below, wherein Cu layers 56a, 56b may be patterned as the corner conductors 20, other conductors, power lines, common lines, bridging lines, etc. Note that there may be one or multiple Cu layers 56a, 56b with polyimide layers 54 positioned between each of the layers 56a, 56b. A conducting back sheet of polyimide 58 can be applied to the polyimide layer 54, which is useful in a space environment in that it will reduce the accumulation of charge. Another capability is the addition of a plated Silver (Ag) or Gold (Au) layer 60 on the Cu layer 56a as part of the corner conductors 20, which improves the ability to make connections.

Shown on the right side is the solar cell 14 that is attached to the substrate 12 with adhesive 62. Also visible is the metal foil interconnect 64 attached to the solar cell 14 and the plated Ag or Au layer 60 of the corner conductors 20.

The substrate 12 also includes one or more insulating layers that separate and/or encapsulate the multilayer conductors. In one example, there are a top polyimide overlay layer 66a and bottom polyimide overlay layer 66b, wherein the top polyimide overlay layer 66a has holes drilled through it, and the holes are Cu-plated vias 68 that electrically connect Cu layer 56a with Cu layer 56b. By encasing the metal of the Cu layers 56a, 56b, the top and bottom polyimide overlay layers 66a, 66b provide valuable protection against ESD.

Electrical access is provided to the buried Cu layer 56b. This could be accomplished with the via 68 connection between Cu layer 56a and Cu layer 56b, or by having an interconnect directly connect to the lower Cu layer 56b. Also, there may be multiple connections between Cu layer 56a and Cu layer 56b. This redundancy is an important attribute and can be employed when possible.

In summary, this new approach attaches the solar cells 14 individually to a substrate 12 such that the corner regions 26 of two, three or four adjacent solar cells 14 are aligned on the substrate 12. The solar cells 14 are laid out so that the cropped corners 24 are aligned and the corner regions 26 are adjacent, thereby exposing an area 28 of the substrate 12. Electrical connections between solar cells 14 are made in these corner regions 26 between front contacts 32 and back contacts 34 on the solar cells 14, bypass diodes 44, and corner conductors 20 on or in the exposed area 28 of the substrate 12, wherein these conductive paths are used to create a string of solar cells 14 in a series connection 48, 50 comprising a circuit. The result is that more electrical connections are available in more corners, which simplifies the corner connections and provides redundancy.

Increasing the size of solar cells 14 is facilitated by this new approach, for example, using full-size solar cells 14, because full-size solar cells 14 produce more power for a fixed amount of parts to assembly or labor cost. However, full-size solar cells 14 typically have one or more grids 36 with thin metal fingers 38 that cause high resistances, which result in power loss. One alternative is to have low resistance fingers 38 that are very wide, but wide fingers 38 block light from entering the solar cell 14 and also reduce power production. Another alternative is to use vias and backside connections.

This disclosure illustrates improved structures using full-size solar cells 14, which extract current from multiple locations around the perimeter of the solar cell 14. This process eliminates the resistance penalty of larger solar cells 14. Furthermore, this disclosure describes a configuration of conductors that is highly manufacturable as well.

FIGS. 15A-15D illustrate how solar cells 14 are made from round wafers 70, according to one example. Various solar cell 14 shapes are diced out of the wafer 70 in order to fill a panel 10a.

Figure 15B:
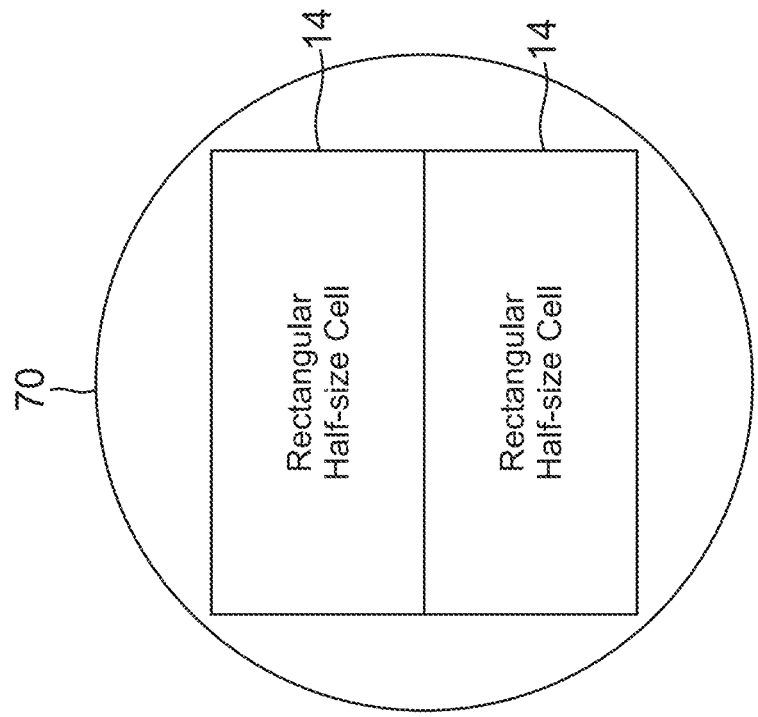
FIGS. 15A-15D illustrate how solar cells are made from round wafers, according to one example.
Figure 15A:
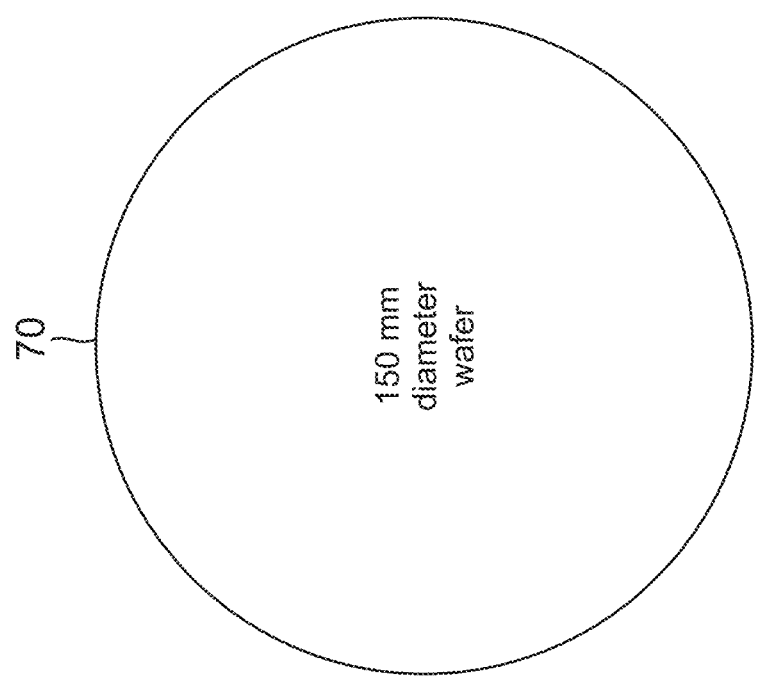

FIG. 15A illustrates a 150 mm diameter wafer 70 that is blank.

FIG. 15B shows a wafer 70 with a pair of rectangular half-size solar cells 14, where there is a large area around the perimeters of the solar cells 14 that will be discarded. This discarded area is highly valuable, and it is desirable to maximize the utilization of the wafer material.

Figure 15D:
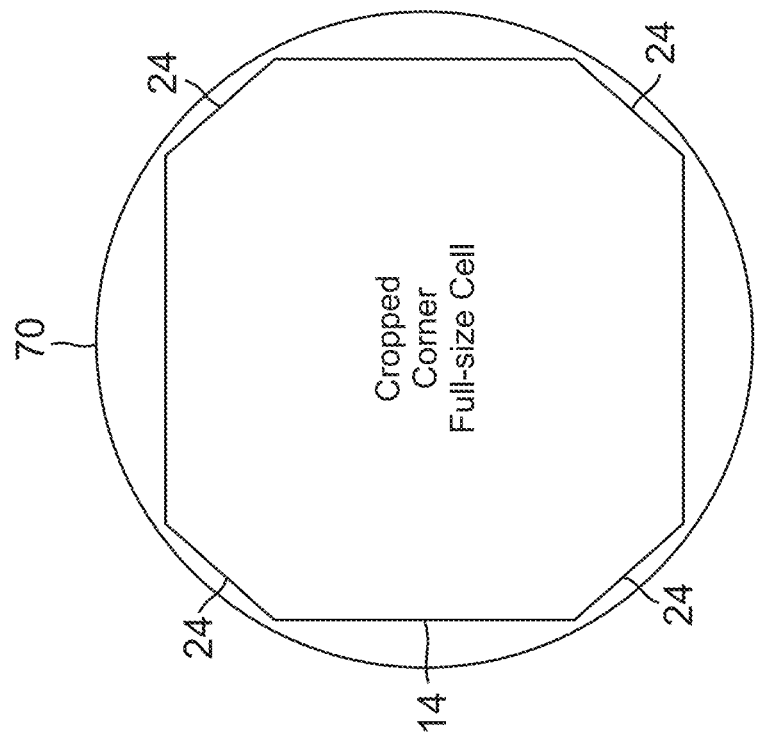
Figure 15C:
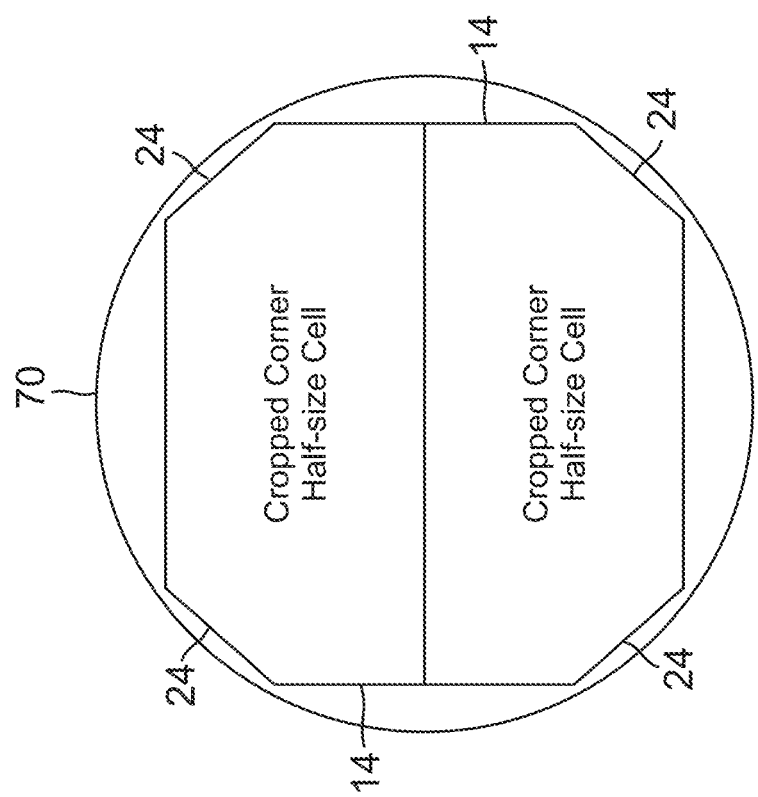

FIG. 15C shows a wafer 70 with a pair of half-size solar cells 14 having cropped corners 24, wherein the cropped corners 24 improve utilization of the wafer 70 area. Specifically, there is a smaller area around the perimeters of the solar cells 14 that will be discarded, as compared to FIG. 15B.

FIG. 15D shows a wafer 70 with a single full-size solar cell 14 having cropped corners 24. Like the half-size solar cells 14 of FIG. 15C, the cropped corners 24 of the single full-size solar cell 14 improve utilization of the wafer 70 area. Specifically, there is a smaller area around the perimeters of the solar cells 14 that will be discarded, as compared to FIG. 15B, wherein the area is roughly equivalent to the area around the perimeters of the solar cells 14 that will be discarded in FIG. 15C.

Figure 16:
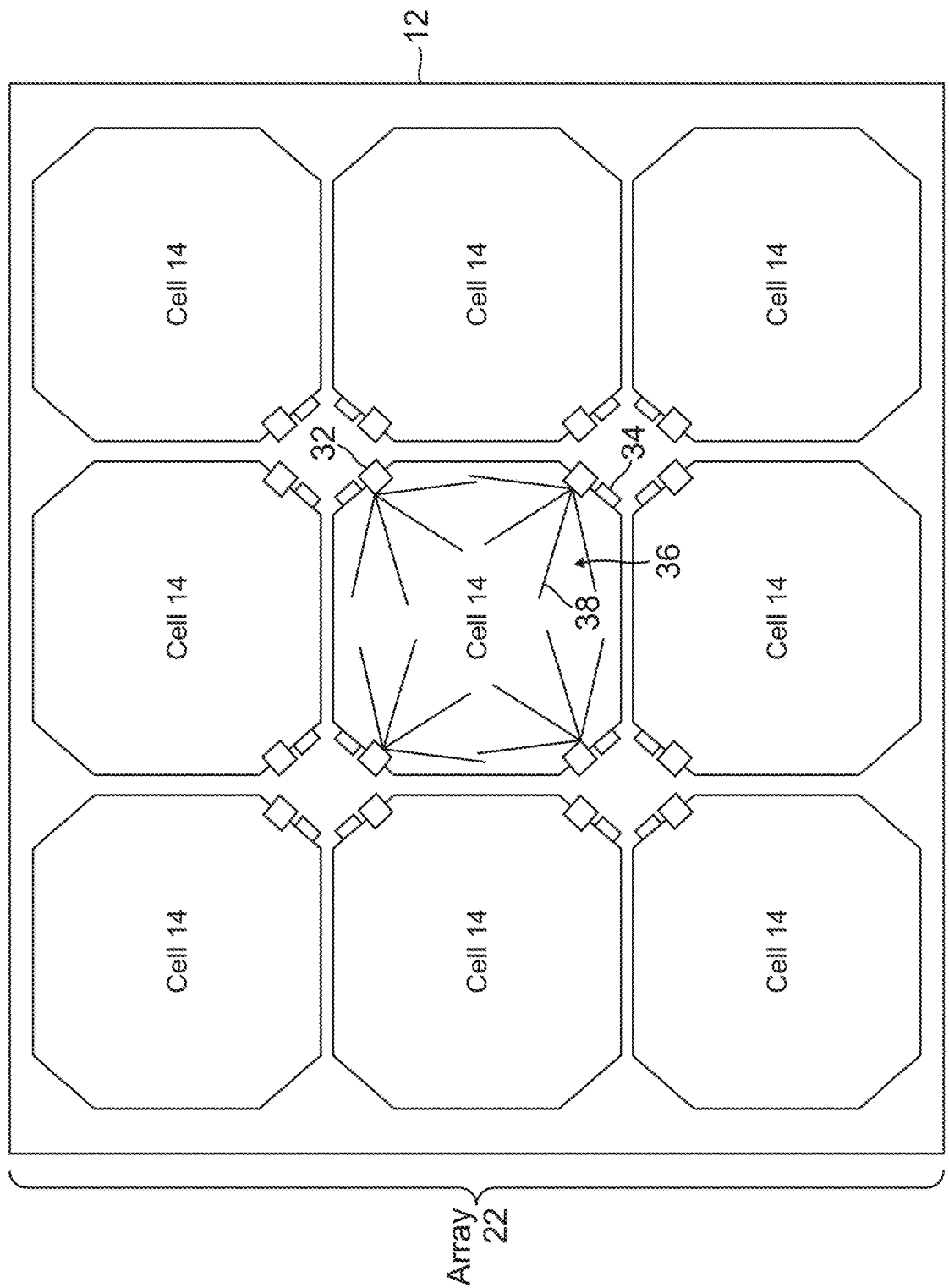
FIG. 16 shows a structure where nine full-size cells are assembled together in a solar cell array comprised of three (3) rows by three (3) columns.

FIG. 16 shows a structure where nine (9) full-size solar cells 14 are assembled together in a solar cell array 22 comprised of three (3) rows by three (3) columns. Multiple grids 36 are shown in the face of the center solar cell 14, wherein each of the grids 36 terminate at one or more of the front contacts 32 of the solar cell 14. (Similar grids 36 would be present on the other solar cells 14 in the array 22, but are omitted to simplify the figure.) By extracting current at multiple points around the perimeter of the solar cell 14, the length of the fingers 38 in each of the grids 36 can be minimized, as compared to a conventional structure for extracting current from a single side of the solar cell 14. These four terminations minimize the distance the current needs to flow, which reduces the impact of resistance. Also, each termination carries one-fourth of the solar cell's current, thereby reducing energy loss, which is determined by the current squared.

Figure 17:
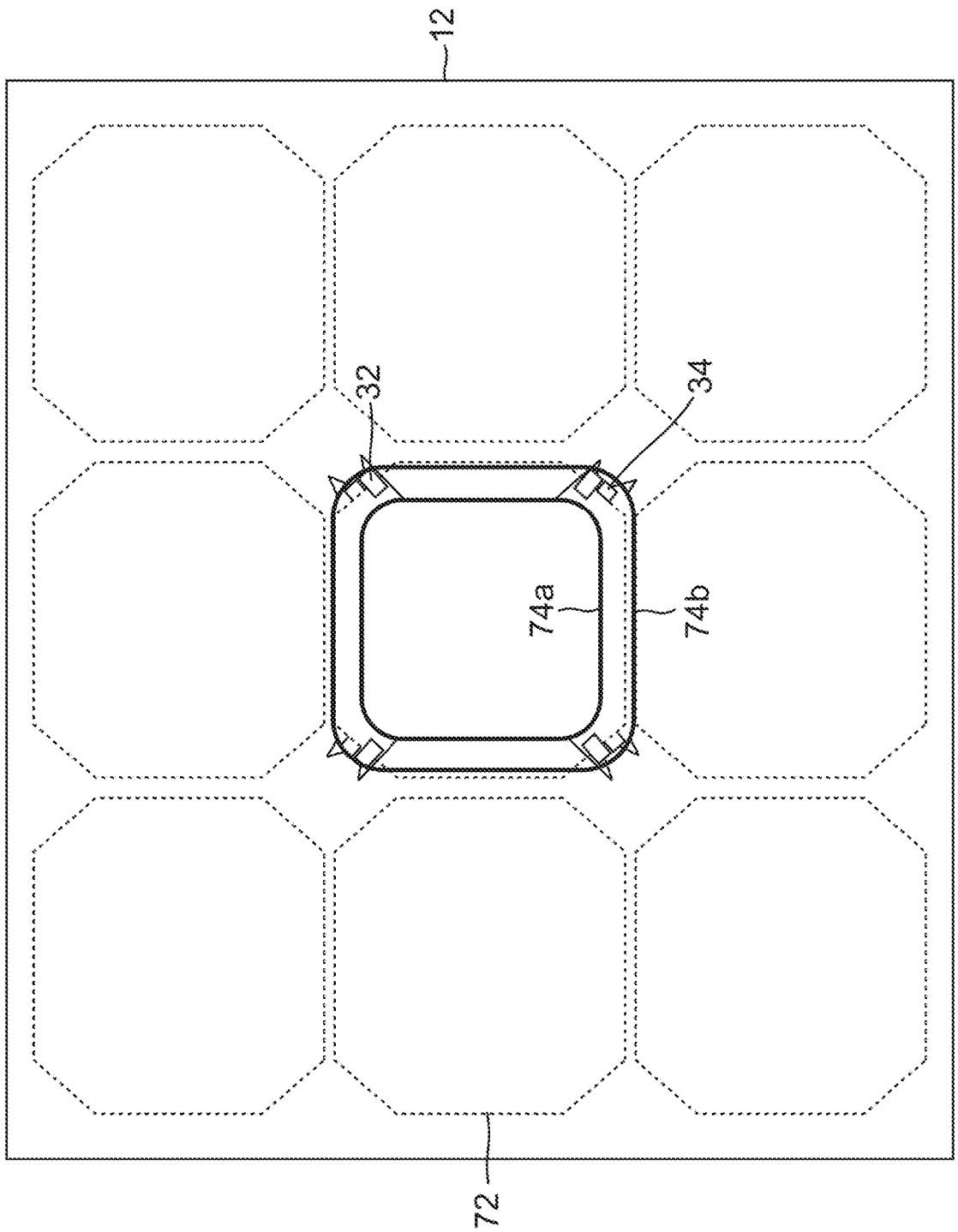
FIG. 17 illustrates the use of buried conductors, according to one example.

FIG. 17 illustrates the use of buried conductors, according to one example. The solar cells 14 are omitted from this view, with their positions 72 when mounted on the substrate 12 indicated by dashed outlines.

The substrate 12 includes conductors 74a, 74b under or alongside each of the cell positions 72. The conductors 74a, 74b are buried conductors patterned in one or more of the Cu layers 56a, 56b of the substrate 12. An insulation layer is placed between these conductors 74a, 74b and the solar cells 14.

In one example, the conductors 74a, 74b are both patterned in the same Cu layer 56a, 56b. The conductors 74a, 74b can also be patterned in different Cu layers 56a, 56b. In one example, the conductors 74a, 74b are loops. However, different shapes may be used, as described in FIGS. 22, 23, and 24 below.

In one example, the conductor 74a connects to the front contacts 32 of the solar cell 14 and the conductor 74b connects to the back contacts 34 of the solar cell 14 (which are shown without the solar cell 14 present). This configuration may be reversed, with the conducting loop of the back contact 34 being inside the conducting loop of the front contact 32

In one example, the conductors 74a, 74b are completely covered by the top polyimide overlay layer 66a, and are connected to the front contacts 32 and back contacts 34 of the solar cell 14 using the vias 68 between layers in the substrate 12. Portions of the conductors 74a, 74b can be exposed through the top polyimide overlay layer 66a, and are connected to the front contacts 32 and back contacts 34 of the solar cell 14 by interconnects.

The conductor 74a can connect to one or more of the four front contacts 32 on the solar cell 14 and the conductor 74b can connect to one or more of the four back contacts 34 on the solar cell 14. This provides redundancy, in case there is a failure of an interconnect or conducting trace.

Because they are buried in the substrate 12, the conductors 74a, 74b do not block any light from entering the solar cells 14. In addition, due to their shape, the conductors 74a, 74b carry current to all sides and corners of the solar cell 14. Preferably, the conductors 74a, 74b are comprised of sufficient metal to be low resistance paths.

Figure 18:
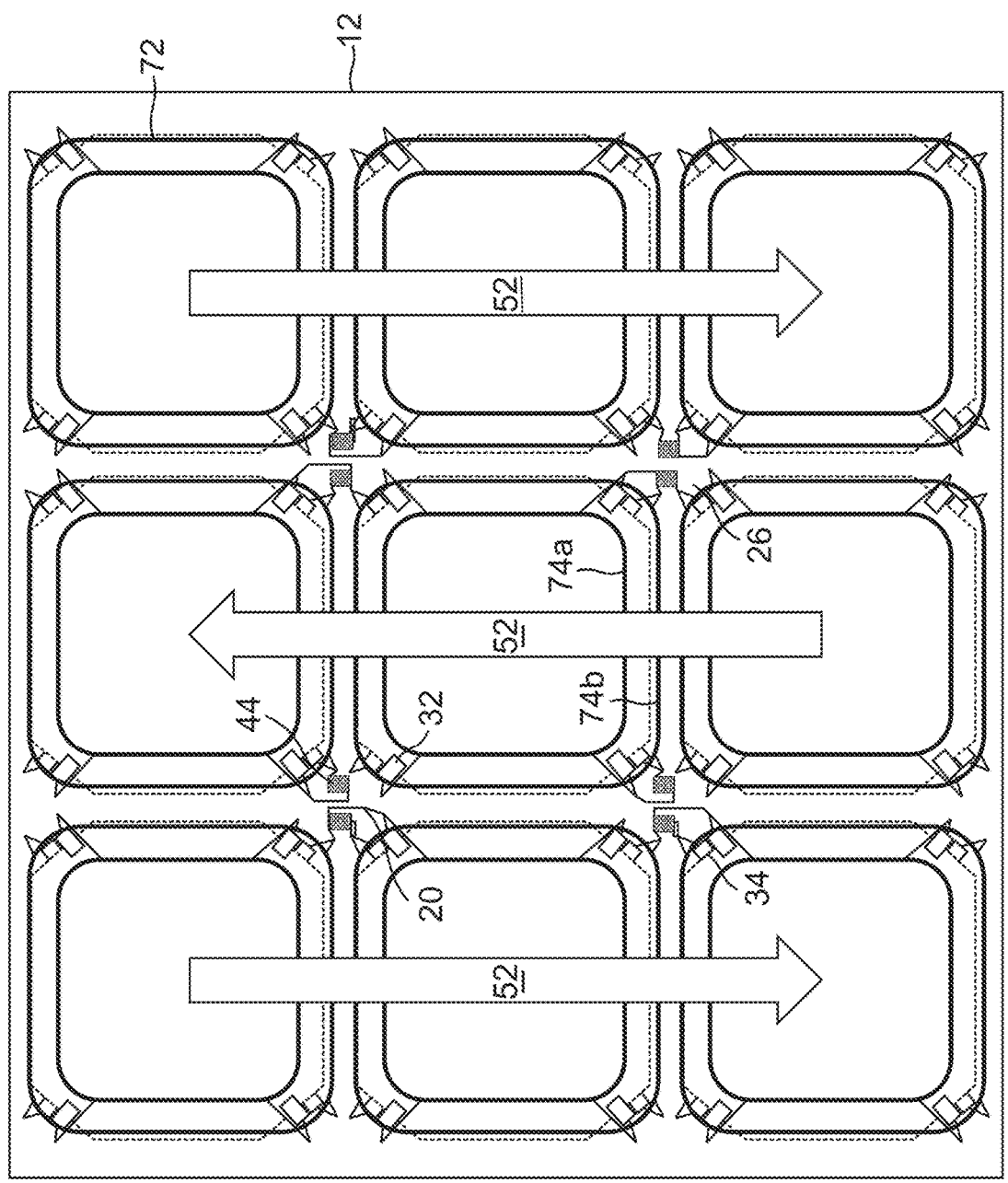
FIG. 18 illustrates one example of series connections between conductors for adjacent cell positions of the substrate.

FIG. 18 illustrates one example of series connections between conductors 74a, 74b for adjacent solar cell positions 72 of the substrate 12. Again, the solar cells 14 are omitted from this view, with their positions 72 on the substrate 12 indicated by dashed outlines. Only the connections adjacent to the center solar cell 14 are fully drawn.

The arrows 52 show the overall direction of current (power) between the cell positions 72. The solar cell's 14 current flows from the front of the solar cell 14 to the backside of the solar cell 14, and then continues to the next solar cell 14 in the string. In this example, the series connections are made in the corner regions 26 surrounding the center cell position 72, and include corner conductors 20 and bypass diodes 44. The series connections and bypass diodes 44 are similar to the example in FIG. 12, wherein each full size solar cell 14 has a series connection and a bypass diode 44 on both sides leading to the next solar cell 14 in series.

Figure 19:
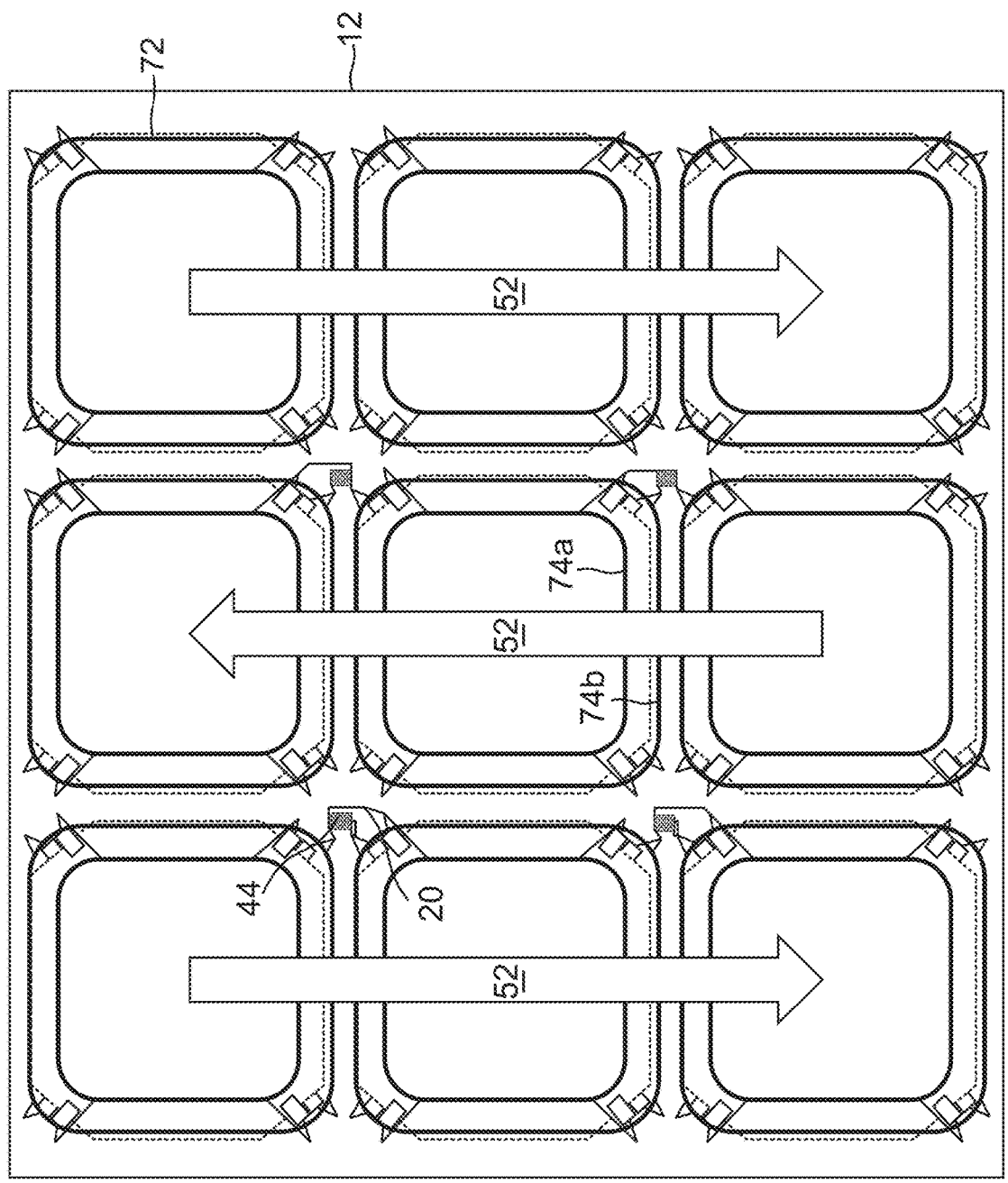
FIG. 19 illustrates another example of series connections between conductors for adjacent cell positions of the substrate.

FIG. 19 illustrates another example of series connections between conductors 74a, 74b for adjacent solar cell positions 72 of the substrate 12. Again, the solar cells 14 are omitted from this view, with their positions 72 on the substrate 12 indicated by dashed outlines. Only the connections adjacent to the center solar cell 14 are fully drawn.

The arrows 52 show the overall direction of current (power) between the cell positions 72. In this example, the series connections are again made in the corner regions 26 surrounding the center cell position 72, and include corner conductors 20 and bypass diodes 44.

However, in this example, each cell position 72 in the first and second columns has only one series connection that includes the corner conductors 20 and one bypass diode 44, leaving the third column open. Moreover, there are fewer corner conductors 20 in the series connections, which can result in less space used on the substrate 12 and higher output, or more widely spaced conductors with a greater resistance to electrostatic discharge (ESD) that operate at higher voltage levels.

Figure 20:
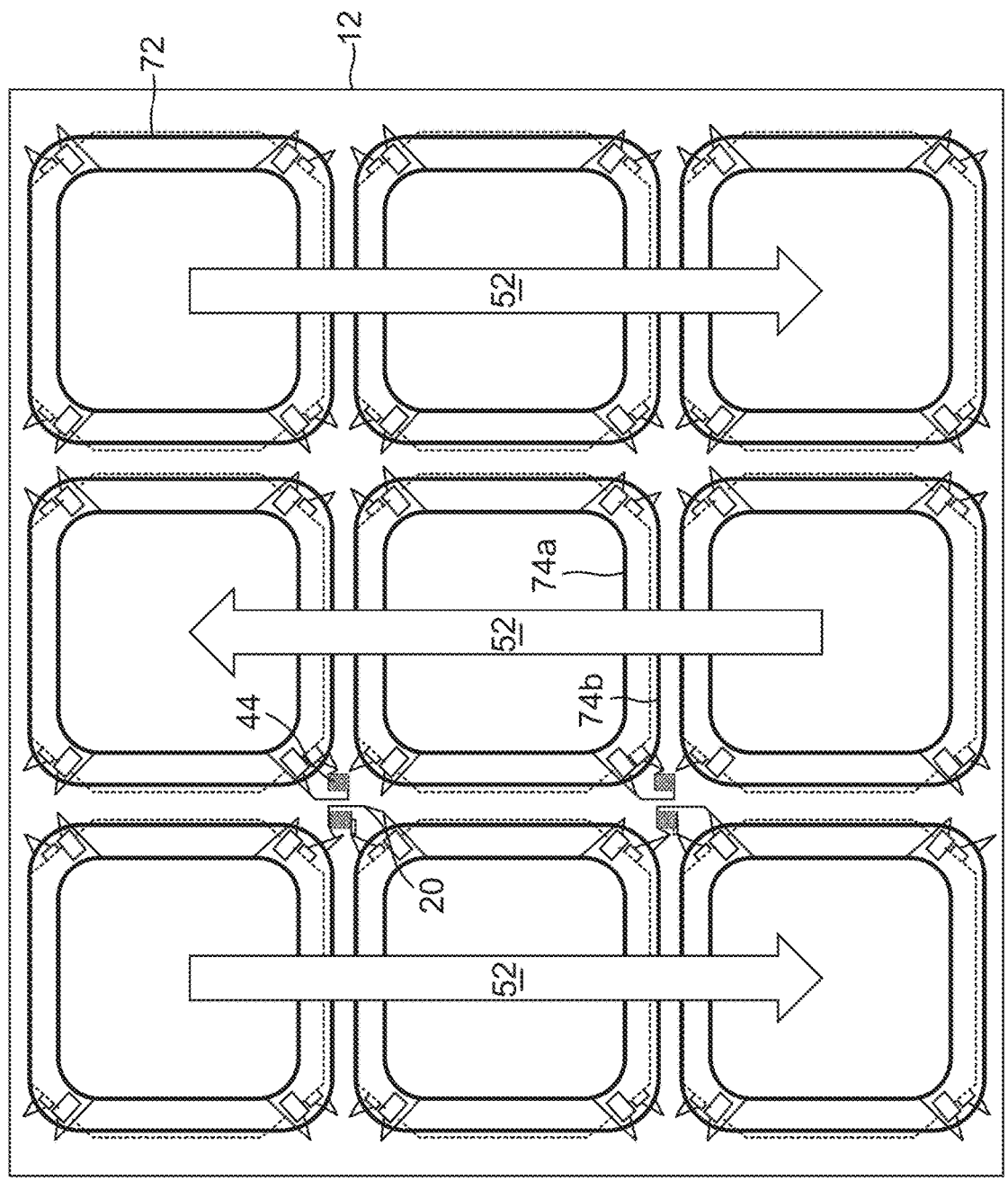
FIG. 20 illustrates another example of series connections between conductors for adjacent cell positions of the substrate 12.

FIG. 20 illustrates another example of series connections between conductors 74a, 74b for adjacent cell positions 72 of the substrate 12. Again, the solar cells 14 are omitted from this view, with their positions 72 on the substrate 12 indicated by dashed outlines. Only the connections adjacent to the center solar cell 14 are fully drawn.

The arrows 52 show the overall direction of current (power) between the cell positions 72. In this example, the series connections are made only in a subset of the corner regions 26 surrounding the center cell position 72, and include corner conductors 20 and bypass diodes 44.

However, in this example, the series connections and bypass diodes 44 are only made on one side of the solar cells 14. The series connections and bypass diodes 44 for the first and second columns of solar cells 14 are made in the space between these solar cells 14. Between the second and third rows of solar cells 14, there are no series connections or bypass diodes 44.

Figure 21:
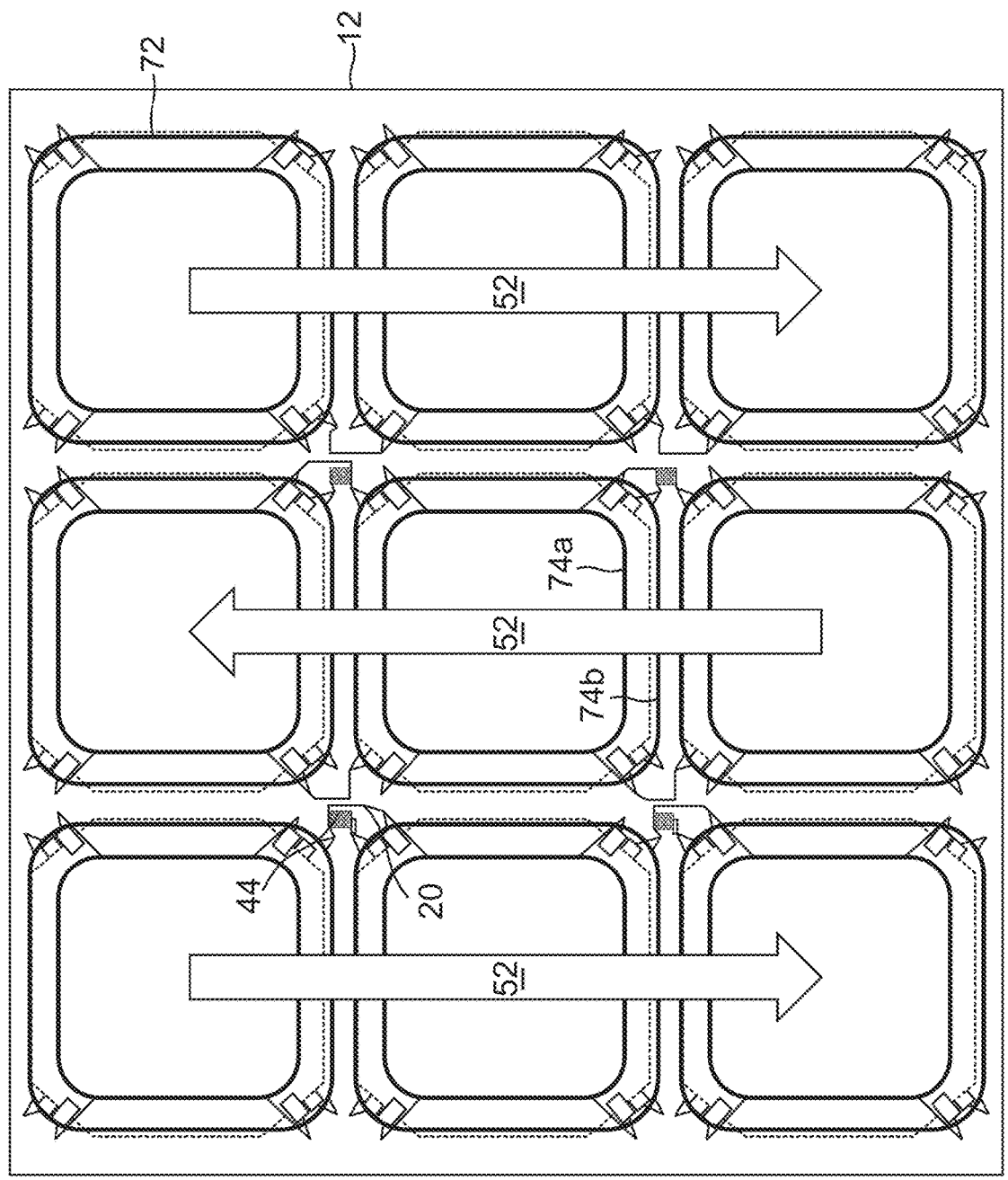
FIG. 21 illustrates another example of series connections between conductors for adjacent cell positions of the substrate.

FIG. 21 illustrates another example of series connections between conductors 74a, 74b for adjacent cell positions 72 of the substrate 12. Again, the solar cells 14 are omitted from this view, with their positions 72 on the substrate 12 indicated by dashed outlines.

The arrows 52 show the overall direction of current (power) between the cell positions 72. In this example, the series connections are again made in the corner regions 26 surrounding the center cell position 72, and include corner conductors 20 and bypass diodes 44. Only the connections adjacent to the center solar cell 14 are fully drawn.

In this example, the series connections are made on both sides of the solar cell 14 adjacent to the next solar cell 14 in series. The bypass diode 44 is only located on one side.

Many variations of these series connections, and other connections, are possible that balance trades of redundancy of conducting paths and connections versus complexity, needed diodes, and spacing between conductors.

Figure 22:
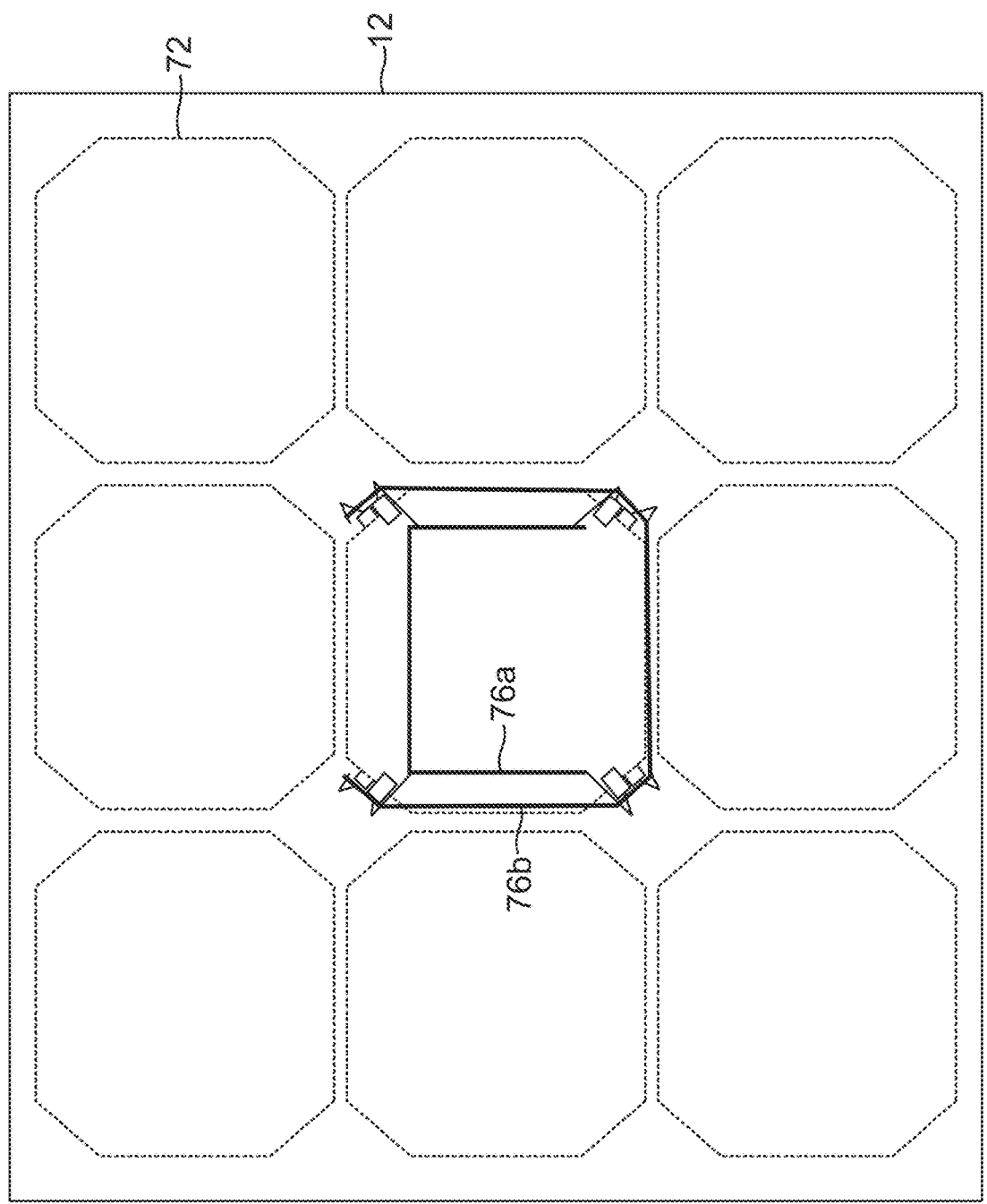
FIG. 22 illustrates a variation in the configuration of buried conductors in the substrate.

FIG. 22 illustrates a variation in the configuration of buried conductors in the substrate 12. In this example, each of the conductors 76a, 76b is U-shaped, with two substantially linear portions connected by an arcuate portion, where the linear portions are substantially parallel to each other. Each of the conductors 76a, 76b connect to all four cropped corners 24 around the perimeter of the cell position 72.

FIG. 23 also illustrates a variation in the configuration of buried conductors in the substrate 12. In this example, the conductors 78a, 78b have only up or down pathways that connect the cropped corners 24 of the cell position 72 in the up/down direction of the current flow 52. This allows the conductors 78a, 78b to pass inside or outside of each other, without crossing. Moreover, the conductors 78a, 78b can be patterned in a single Cu layer 56a or Cu layer 56b without need for vias 68, which simplifies fabrication of the circuit. However, this configuration does require series connection on both sides of the cell position 72. Moreover, the back layer 42 of the solar cell 14 enables a single bypass diode 44 to be used.

FIG. 24 illustrates another variation in the buried conductors in the substrate 12.

The back contact 34 does not connect to a buried conductor. Instead, the back layer 42 of the solar cell 14 is used to carry current to the back contacts 34 of the solar cell 14, which eliminates the need for a buried conductor. The back contacts 34 carry current to the series-connected adjacent cell positions 72 via corner conductors 20. There is also a bypass diode 44 in these series connections.

In addition, there is a single buried conductor 80 connected to the front contacts 32 and their respective grids 36. Specifically, the conductor 80 connects between two front contacts 32 parallel to the direction of current flow 52, which in this example is up/down and not left/right.

Examples of the disclosure may be described in the context of a method 82 of fabricating a solar cell 14, solar cell panel 10a and/or satellite, comprising steps 84-96, as shown in FIG. 25, wherein the resulting satellite 98 having a solar cell panel 10a comprised of solar cells 14 are shown in FIG. 26.

As illustrated in FIG. 25, during pre-production, exemplary method 82 may include specification and design 84 of the solar cell 14, solar cell panel 10a and/or satellite 98, and material procurement 86 for same. During production, component and subassembly manufacturing 88 and system integration 90 of the solar cell 14, solar cell panel 10a and/or satellite 98 takes place, which include fabricating the solar cell 14, solar cell panel 10a and/or satellite 98. Thereafter, the solar cell 14, solar cell panel 10a and/or satellite 98 may go through certification and delivery 92 in order to be placed in service 94. The solar cell 14, solar cell panel 10a and/or satellite 98 may also be scheduled for maintenance and service 96 (which includes modification, reconfiguration, refurbishment, and so on), before being launched.

Each of the processes of method 82 may be performed or carried out by a system integrator, a third party, and/or an operator (e.g., a customer). For the purposes of this description, a system integrator may include without limitation any number of solar cell, solar cell panel, satellite or spacecraft manufacturers and major-system subcontractors; a third party may include without limitation any number of venders, subcontractors, and suppliers; and an operator may be a satellite company, military entity, service organization, and so on.

As shown in FIG. 26, a satellite 98 fabricated by exemplary method 82 may include systems 100, a body 102, solar cell panels 10a comprised of solar cells 14, and one or more antennae 104. Examples of the systems 100 included with the satellite 98 include, but are not limited to, one or more of a propulsion system 106, an electrical system 108, a communications system 110, and a power system 112. Any number of other systems 100 also may be included.

FIG. 27 is an illustration of the solar cell panel 10a in the form of a functional block diagram, according to one example. The solar cell panel 10a is comprised of the solar cell array 22, which is comprised of one or more of the solar cells 14 individually attached to the substrate 12. Each of the solar cells 14 absorbs light 114 from a light source 116 and generates an electrical output 118 in response thereto.

At least one of the solar cells 14 has at least one cropped corner 24 that defines a corner region 26, such that an area 28 of the substrate 12 remains exposed when the solar cell 14 is attached to the substrate 12. When a plurality of solar cells 14 are attached to the substrate 12, the corner regions 26 of adjacent ones of the solar cells 14 are aligned, thereby exposing the area 28 of the substrate 12.

The area 28 of the substrate 12 that remains exposed includes one or more corner conductors 20 attached to, printed on, or integrated with the substrate 12, and one or more electrical connections between the solar cells 14 and the corner conductors 20 are made in a corner region 26. The corner region 26 may also include one or more bypass diodes 44.

The corner region 26 includes at least one contact, for example, a front contact 32 on a front side of the solar cell 14 and/or a back contact 34 on a back side of the solar cell 14.

The substrate 12 may include buried conductors 74a, 74b, 76a, 76b, 78a, 78b, 80, wherein the buried conductors 74a, 74b, 76a, 76b, 78a, 78b, 80 provide conductive paths for the front and back contacts 32, 34 of the solar cell 14. The buried conductors 74a, 74b, 76a, 76b, 78a, 78b, 80 also facilitate connections between solar cells 14.

The examples discussed present series connections between the solar cells 14. With slight modification, these can terminate strings as discussed in the cross-referenced patent applications identified above.

The description of the examples set forth above has been presented for purposes of illustration and description, and is not intended to be exhaustive or limited to the examples described. Many alternatives, modifications and variations may be used in place of the specific elements described above.

What is claimed is:

1. A method, comprising:
   attaching a solar cell to a substrate, wherein:
   the solar cell has cropped corners that define corner regions exposing areas of the substrate;
   the solar cell has front contacts in each of the cropped corners extending into the corner regions;
   the solar cell has grids on a surface thereof for collecting current generated by the solar cell;
   the grids terminate at the front contacts in each of the cropped corners;
   the substrate includes corner conductors on the exposed areas of the substrate connected to electrical conductors buried in the substrate that carry current to the front contacts in each of the cropped corners of the solar cell;
   the electrical conductors buried in the substrate are located under or alongside the solar cell; and
   electrical connections are made between the corner conductors on the exposed areas of the substrate and the front contacts in each of the cropped corners of the solar cell using interconnects.

2. The method of claim 1, wherein the electrical conductors of the substrate distribute the current from the solar cell to a next series-connected solar cell or string termination conductor.

3. The method of claim 1, wherein the electrical conductors located under or alongside the solar cell comprise loops.

4. The method of claim 1, wherein the electrical conductors located under or alongside the solar cell comprise loops include two substantially linear portions connected by an arcuate portion, and the linear portions are substantially parallel to each other.

5. The method of claim 1, wherein the electrical conductors located under or alongside the solar cell are parallel to a direction of current flow.

6. The method of claim 1, wherein the solar cell has at least one of the cropped corners, and the electrical conductors of the substrate distribute the current to the at least one of the cropped corners.

7. The method of claim 6, wherein the solar cell has four of the cropped corners and the electrical conductors of the substrate distribute the current to the four cropped corners.

8. A device, comprising:
   a solar cell attached to a substrate, wherein:
   the solar cell has cropped corners that define corner regions exposing areas of the substrate;
   the solar cell has front contacts in each of the cropped corners extending into the corner regions;
   the solar cell has grids on a front surface thereof for collecting current generated by the solar cell;
   the grids terminate at the front contacts in each of the cropped corners;
   the substrate includes corner conductors on the exposed areas of the substrate connected to electrical conductors buried in the substrate that carry current to the front contacts in each of the cropped corners of the solar cell;
   the electrical conductors buried in the substrate are located under or alongside the solar cell; and
   electrical connections are made between the corner conductors on the exposed areas of the substrate and the front contacts in each of the cropped corners of the solar cell using interconnects.

9. The device of claim 8, wherein the electrical conductors of the substrate distribute the current from the solar cell to a next series-connected solar cell or string termination conductor.

10. The device of claim 8, wherein the electrical conductors located under or alongside the solar cell comprise loops.

11. The device of claim 8, wherein the electrical conductors located under or alongside the solar cell comprise loops include two substantially linear portions connected by an arcuate portion, and the linear portions are substantially parallel to each other.

12. The device of claim 8, wherein the electrical conductors located under or alongside the solar cell are parallel to a direction of current flow.

13. The device of claim 8, wherein the solar cell has at least one of the cropped corners, and the electrical conductors of the substrate distribute the current to the at least one of the cropped corners.

14. The device of claim 13, wherein the solar cell has four of the cropped corners and the electrical conductors of the substrate distribute the current to the four cropped corners.

15. A solar cell panel, comprising:
- a solar cell array comprised of at least one solar cell attached to a substrate, wherein:
- the solar cell has cropped corners that define corner regions exposing areas of the substrate;
- the solar cell has front contacts in each of the cropped corners extending into the corner regions;
- the solar cell has grids on a front surface thereof for collecting current generated by the solar cell;
- the grids terminate at the front contacts in each of the cropped corners;
- the substrate includes corner conductors on the exposed areas of the substrate connected to electrical conductors buried in the substrate that carry current to the front contacts in each of the cropped corners of the solar cell;
- the electrical conductors buried in the substrate are located under or alongside the solar cell; and
- electrical connections are made between the corner conductors on the exposed areas of the substrate and the front contacts in each of the cropped corners of the solar cell using interconnects.

16. The solar cell panel of claim 15, wherein the electrical conductors of the substrate distribute the current from the solar cell to a next series-connected solar cell or string termination conductor.

17. The solar cell panel of claim 15, wherein the electrical conductors located under or alongside the solar cell comprise loops.

18. The solar cell panel of claim 15, wherein the electrical conductors located under or alongside the solar cell comprise loops include two substantially linear portions connected by an arcuate portion, and the linear portions are substantially parallel to each other.

19. The solar cell panel of claim 15, wherein the electrical conductors located under or alongside the solar cell are parallel to a direction of current flow.

20. The solar cell panel of claim 15, wherein the solar cell has at least one of the cropped corners, and the electrical conductors of the substrate distribute the current to the at least one of the cropped corners.

21. The solar cell panel of claim 20, wherein the solar cell has four of the cropped corners and the electrical conductors of the substrate distribute the current to the four cropped corners.

* * * * *